US012575355B2

(12) United States Patent
Chen et al.

(10) Patent No.: US 12,575,355 B2
(45) Date of Patent: *Mar. 10, 2026

(54) MASKING LAYER WITH POST TREATMENT

(71) Applicant: Taiwan Semiconductor Manufacturing Co., Ltd., Hsinchu (TW)

(72) Inventors: Wen-Ju Chen, New Taipei City (TW); Chung-Ting Ko, Kaohsiung City (TW); Wan-Chen Hsieh, Hsinchu (TW); Chun-Ming Lung, Hsinchu (TW); Tai-Chun Huang, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 91 days.

This patent is subject to a terminal disclaimer.

(21) Appl. No.: 18/341,410

(22) Filed: Jun. 26, 2023

(65) Prior Publication Data

US 2023/0335406 A1      Oct. 19, 2023

Related U.S. Application Data

(63) Continuation of application No. 17/038,499, filed on Sep. 30, 2020, now Pat. No. 11,728,173.

(51) Int. Cl.
*H01L 21/308* (2006.01)
*H01L 21/02* (2006.01)
(Continued)

(52) U.S. Cl.
CPC ...... *H01L 21/3085* (2013.01); *H01L 21/0234* (2013.01); *H01L 21/02348* (2013.01); *H01L 21/02356* (2013.01); *H01L 21/02521* (2013.01); *H01L 21/02529* (2013.01); *H01L 21/02532* (2013.01); *H01L 21/02603* (2013.01); *H01L 21/3065* (2013.01); *H01L 21/3086* (2013.01);
(Continued)

(58) Field of Classification Search
CPC ..... H01L 21/823807; H01L 21/823814; H01L 29/7848
See application file for complete search history.

(56) References Cited

U.S. PATENT DOCUMENTS 6,045,665 A      4/2000  Ohhashi et al.
6,544,896 B1     4/2003  Xu et al.
(Continued)

FOREIGN PATENT DOCUMENTS

JP        H05251443 A      9/1993
TW        I506726 B        11/2015
(Continued)

*Primary Examiner* — Brian Turner
(74) *Attorney, Agent, or Firm* — Slater Matsil, LLP

(57) ABSTRACT

A method includes forming a semiconductor layer over a substrate; etching a portion of the semiconductor layer to form a first recess and a second recess; forming a first masking layer over the semiconductor layer; performing a first thermal treatment on the first masking layer, the first thermal treatment densifying the first masking layer; etching the first masking layer to expose the first recess; forming a first semiconductor material in the first recess; and removing the first masking layer.

20 Claims, 64 Drawing Sheets

(51) Int. Cl.

| | |
|---|---|
| *H01L 21/3065* | (2006.01) |
| *H01L 21/311* | (2006.01) |
| *H10D 30/01* | (2025.01) |
| *H10D 30/67* | (2025.01) |
| *H10D 62/00* | (2025.01) |
| *H10D 62/10* | (2025.01) |
| *H10D 64/01* | (2025.01) |
| *H10D 84/01* | (2025.01) |
| *H10D 84/03* | (2025.01) |
| *H10D 84/85* | (2025.01) |

(52) U.S. Cl.

CPC ...... *H01L 21/31111* (2013.01); *H10D 30/031* (2025.01); *H10D 30/6713* (2025.01); *H10D 30/6729* (2025.01); *H10D 30/6735* (2025.01); *H10D 30/6757* (2025.01); *H10D 62/021* (2025.01); *H10D 62/121* (2025.01); *H10D 64/017* (2025.01); *H10D 64/018* (2025.01); *H10D 84/0167* (2025.01); *H10D 84/017* (2025.01); *H10D 84/0172* (2025.01); *H10D 84/0184* (2025.01); *H10D 84/0186* (2025.01); *H10D 84/038* (2025.01); *H10D 84/85* (2025.01)

(56) References Cited

U.S. PATENT DOCUMENTS

| | | | |
|---|---|---|---|
| 8,916,433 | B2 | 12/2014 | Scheiper et al. |
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 10,062,692 | B1 | 8/2018 | Ray et al. |
| 10,510,762 | B2 | 12/2019 | Chiou et al. |
| 10,699,965 | B1 | 6/2020 | Greene et al. |
| 2004/0214427 | A1 | 10/2004 | Kloster et al. |
| 2004/0238895 | A1 | 12/2004 | Mutou |
| 2008/0277686 | A1 | 11/2008 | Tsai |
| 2009/0250840 | A1 | 10/2009 | Selinidis et al. |
| 2010/0219475 | A1 | 9/2010 | Kronholz et al. |
| 2011/0204488 | A1* | 8/2011 | Itou .......................... H01L 21/78 257/E29.022 |
| 2011/0232564 | A1 | 9/2011 | Takeyama |
| 2013/0247972 | A1* | 9/2013 | Mungekar ............. H10F 77/311 438/57 |
| 2014/0124794 | A1 | 5/2014 | Weihua et al. |
| 2017/0125527 | A1* | 5/2017 | Pillarisetty ........... H10D 62/822 |
| 2018/0254380 | A1 | 9/2018 | Muroo et al. |
| 2019/0214552 | A1* | 7/2019 | Gajek .................... H10N 50/10 |
| 2020/0166720 | A1 | 5/2020 | Charles et al. |

FOREIGN PATENT DOCUMENTS

| | | | |
|---|---|---|---|
| TW | 201824547 | A | 7/2018 |
| WO | 2016136547 | A1 | 9/2016 |

* cited by examiner

MASKING LAYER WITH POST TREATMENT

PRIORITY CLAIM AND CROSS-REFERENCE

This application is a continuation of U.S. patent application Ser. No. 17/038,499, filed on Sep. 30, 2020, entitled "Masking Layer with Post Treatment," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
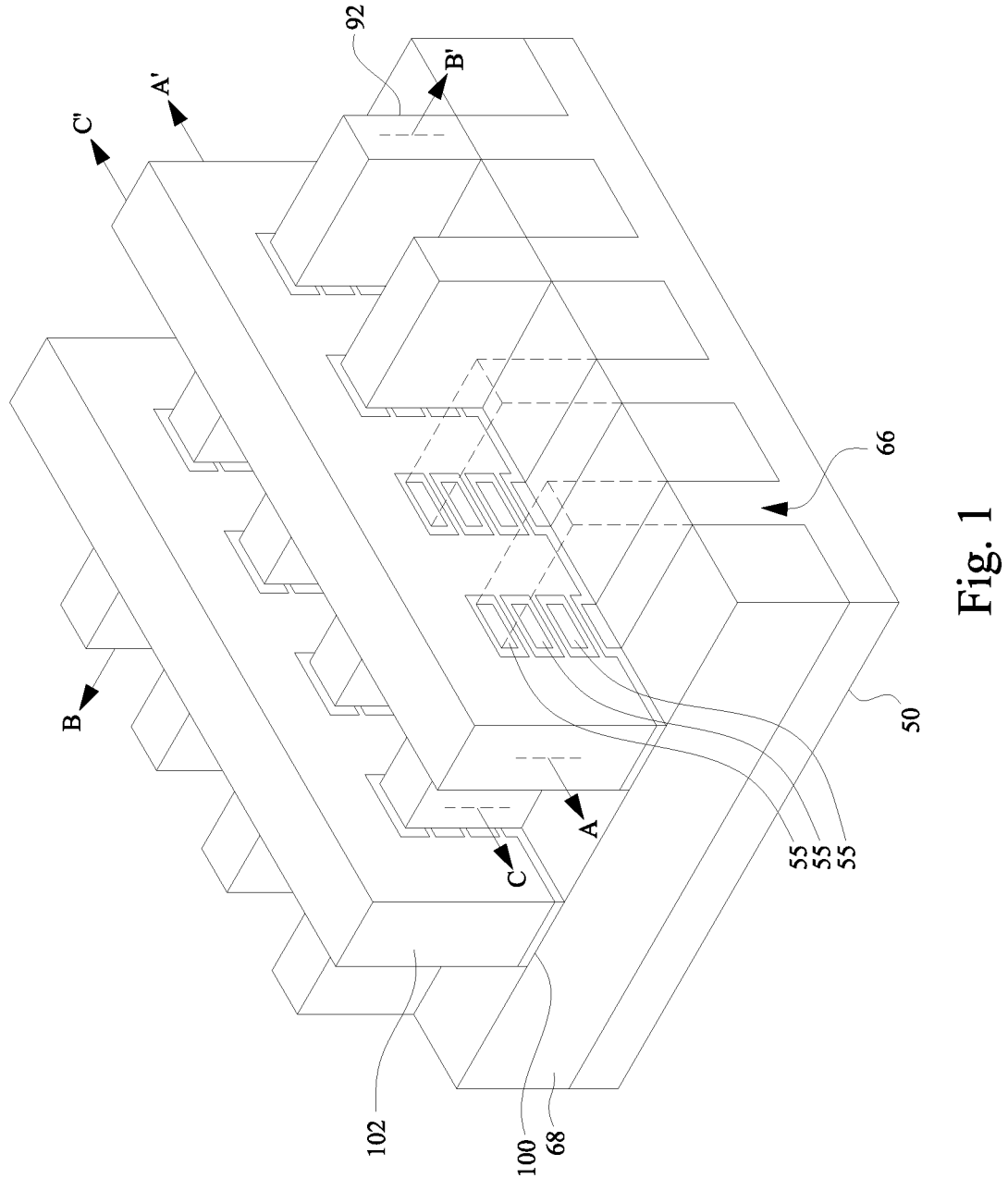
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods for forming a die comprising nano-FETs. The methods include forming stacks of semiconductor layers and etching those stacks to form epitaxial source/drain regions. Regions of the die dedicated to p-type transistors may be masked while forming or treating features within regions of the die dedicated to n-type transistors. Similarly, regions of the die dedicated to n-type transistors may be masked while forming or treating features within regions of the die dedicated to p-type transistors. The various mask layers may be formed and treated in such a way to improve the efficiency of those other processes while also making the various mask layers easier to remove afterward. Gate structures may then be formed over the stacks of semiconductor layers to form transistor structures. In addition, a front-side interconnect structure may be formed over a first side of the transistor structures, and a backside interconnect structure may be formed over an opposite side of the transistor structures. Various embodiments may be applied, however, to dies comprising other types of transistors (e.g., fin field effect transistors (Fin-FETs), planar transistors, or the like) in lieu of or in combination with the nano-FETs.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowires, or the like) over fins 66 on a substrate 50 (e.g., a semiconductor substrate), wherein the nanostructures 55 act as channel regions for the nano-FETs. The nanostructures 55 may include p-type nanostructures, n-type nanostructures, or a combination thereof. Shallow trench isolation (STI) regions 68 are disposed between adjacent fins 66, which may protrude above and from between neighboring STI regions 68. Although the STI regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring STI regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano-FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 28C are cross-sectional views of intermediate stages in the manufacturing of nano-FETs, in accordance with some embodiments. FIGS. 2 through 5, 6A, 21A, 22A, 23A, 24A, 25A, 26A, 27A, and 28A illustrate reference cross-section A-A' illustrated in FIG. 1. FIGS. 6B, 7B, 8B, 9B, 10B, 11B, 11C, 12B, 13B, 13C, 14B, 15B, 16B, 17B, 17D, 18B, 19B, 20B, 20D, 21B, 22B, 23B, 24B, 25B, 26B, 27B, and 28B illustrate reference cross-section B-B' illustrated in FIG. 1. FIGS. 7A, 8A, 9A, 10A, 11A, 12A, 13A, 14A, 15A, 15C, 16A, 16C, 17A, 17C, 18A, 18C, 19A, 19C, 20A, 20C, 21C, 26C, 27C, and 28C illustrate reference cross-section C-C' illustrated in FIG. 1.

Figure 2:
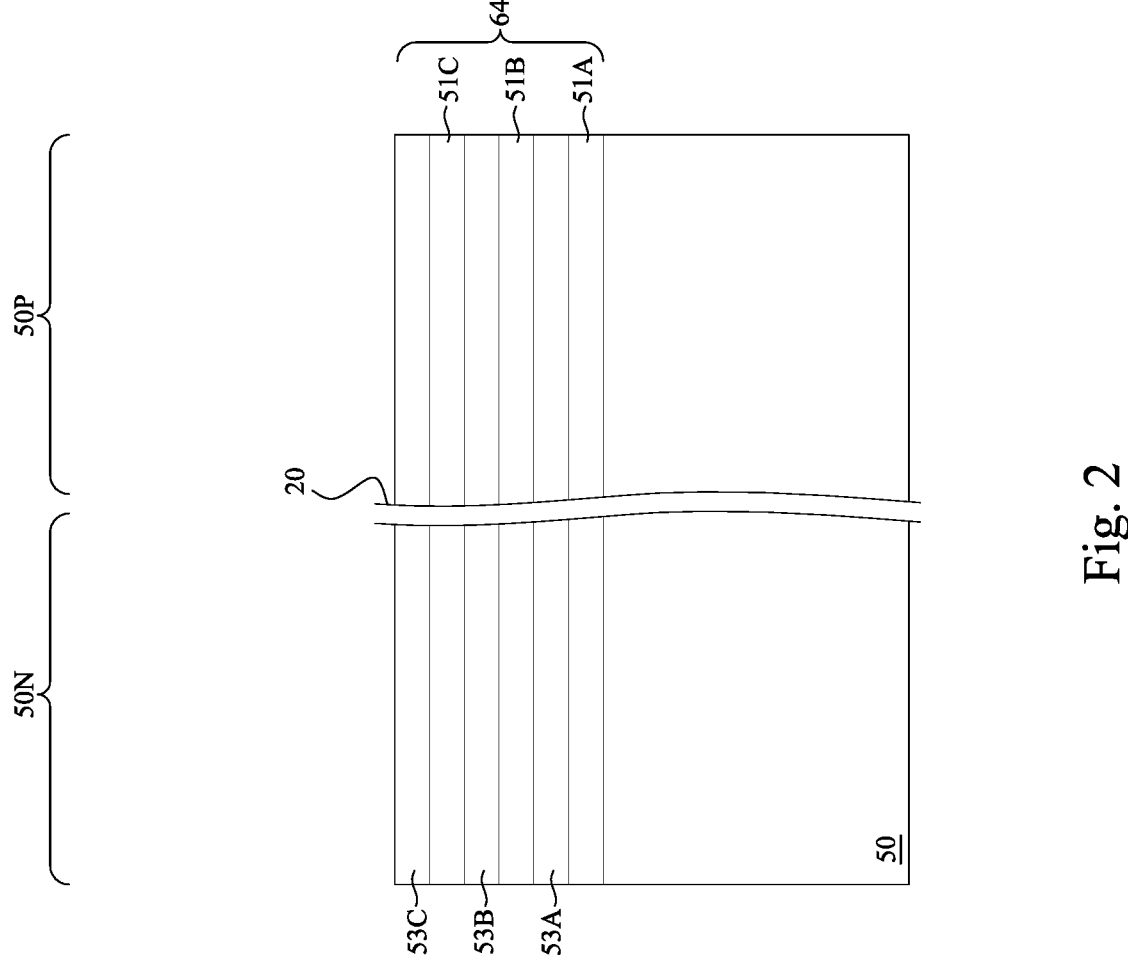
FIGS. 2, 3, 4, 5, 6A, 6B, 7A, 7B, 8A, 8B, 9A, 9B, 10A, 10B, 11A, 11B, 12A, 12B, 13A, 13B, 13C, 14A, 14B, 15A, 15B, 15C, 16A, 16B, 16C, 17A, 17B, 17C, 17D, 18A, 18B, 18C, 19A, 19B, 19C, 20A, 20B, 20C, 20D, 21A, 21B, 21C, 22A, 22B, 23A, 23B, 24A, 24B, 25A, 25B, 26A, 26B, 26C, 27A, 27B, 27C, 28A, 28B, and 28C are cross-sectional views of intermediate stages in the manufacturing of nano-FETs, in accordance with some embodiments.

In FIG. 2, the substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the p-type region 50P. Also, the first semiconductor layers 51 will be removed and the second semiconductor layers 53 will be patterned to form channel regions of nano-FETs in the n-type regions 50N. Nevertheless, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type regions 50P. In still other embodiments, the first semiconductor layers 51 may be removed and the second semiconductor layers 53 may be patterned to form channel regions of nano-FETS in both the n-type region 50N and the p-type region 50P. In other embodiments, the second semiconductor layers 53 may be removed and the first semiconductor layers 51 may be patterned to form channel regions of non-FETs in both the n-type region 50N and the p-type region 50P.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type NSFETS. Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type NSFETS.

Figure 3:
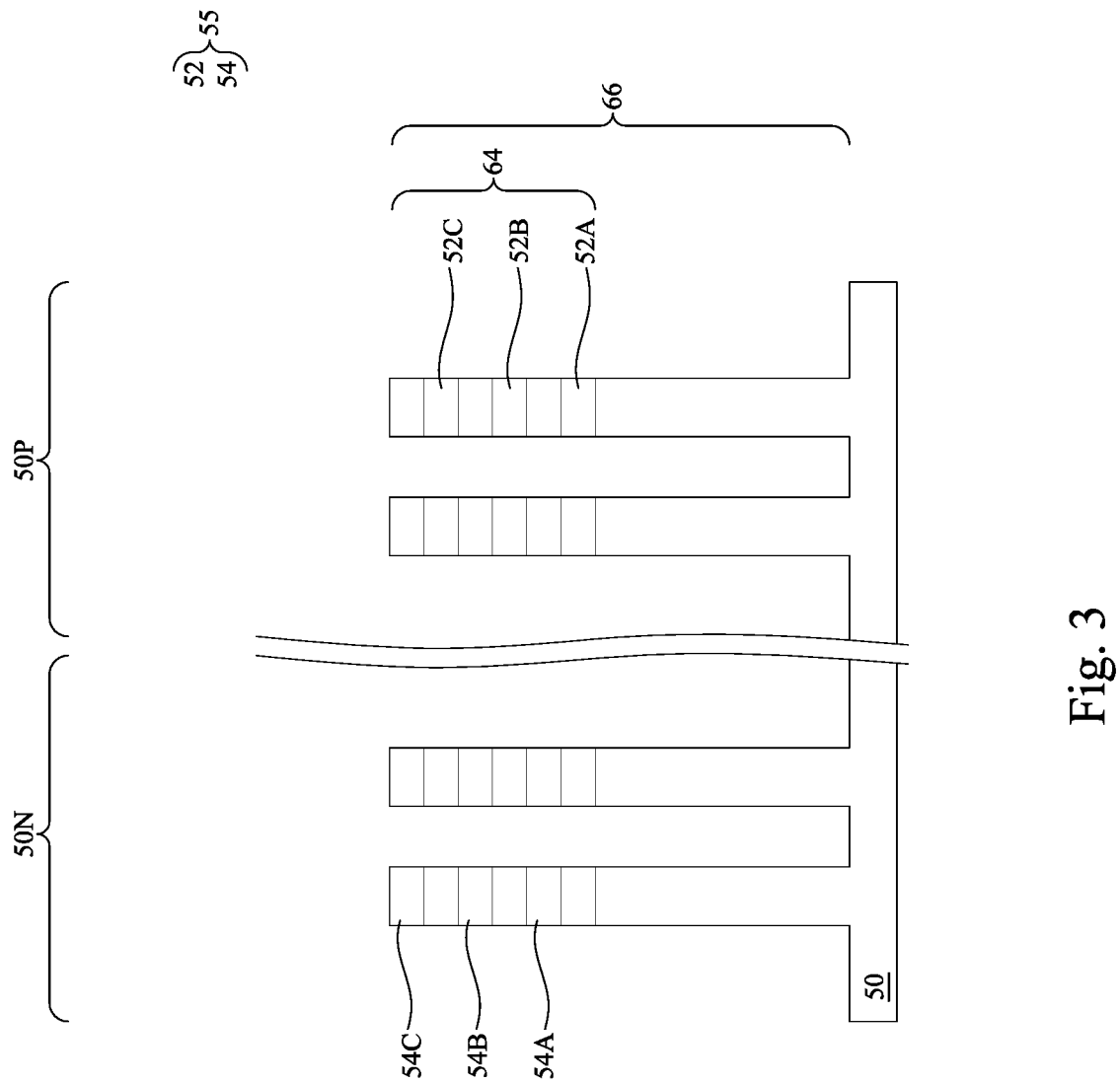

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithog-raphy process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trap-ezoidal in shape.

Figure 4:
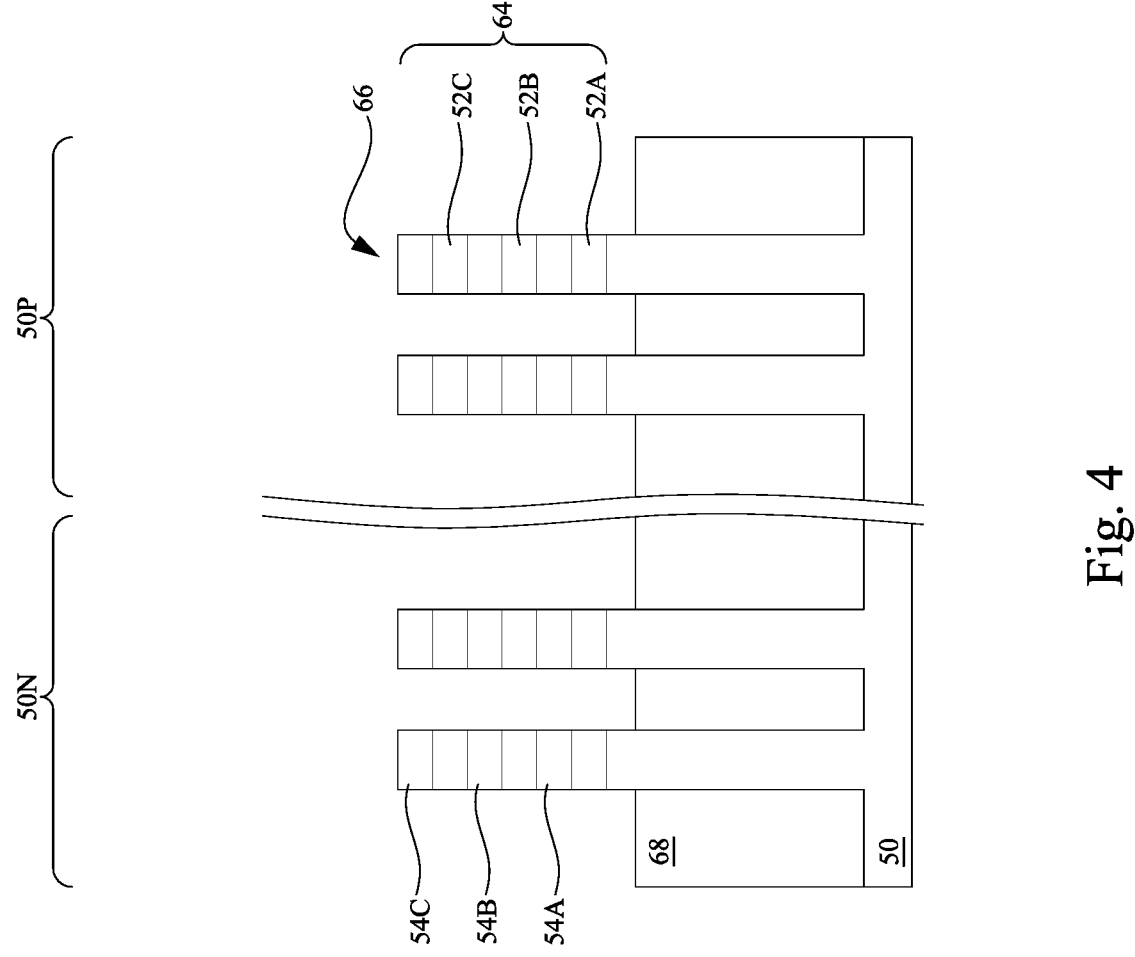

In FIG. 4, shallow trench isolation (STI) regions 68 are formed adjacent the fins 66. The STI regions 68 may be formed by depositing an insulation material over the sub-strate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combi-nation thereof. Other insulation materials formed by any acceptable process may be used. In the illustrated embodi-ment, the insulation material is silicon oxide formed by an FCVD process. An anneal process may be performed once the insulation material is formed. In an embodiment, the insulation material is formed such that excess insulation material covers the nanostructures 55. Although the insula-tion material is illustrated as a single layer, some embodi-ments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostruc-tures 55 such that top surfaces of the nanostructures 55 and the insulation material are level after the planarization process is complete.

The insulation material is then recessed to form the STI regions 68. The insulation material is recessed such that upper portions of fins 66 in the region 50N and the region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielec-tric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials dis-cussed above, such as the first semiconductor materials and the second semiconductor materials. In some embodiments where epitaxial structures are epitaxially grown, the epitaxi-ally grown materials may be in situ doped during growth, which may obviate prior and/or subsequent implantations, although in situ and implantation doping may be used together.

Additionally, the first semiconductor layers 51 (and resulting first nanostructures 52) and the second semicon-ductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illus-trated) may be formed in the fins 66, the nanostructures 55, and/or the STI regions 68. In embodiments with different well types, different implant steps for the n-type region 50N and the p-type region 50P may be achieved using a photo-resist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using one or more spin-on or deposition techniques and can be patterned using acceptable photolithography techniques. Once the photoresist is patterned, an n-type impurity implant is per-formed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using one or more spin-on or deposition techniques and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
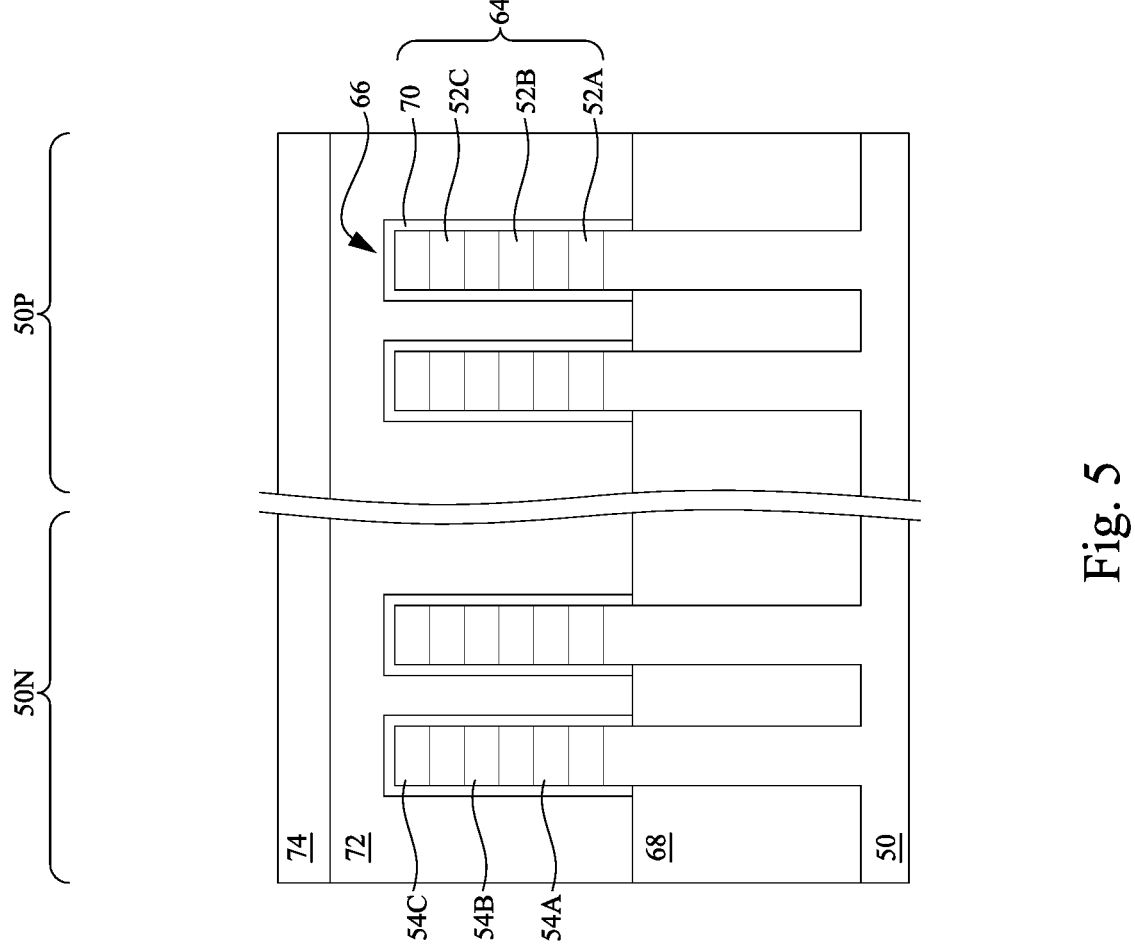

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nano-structures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6A:
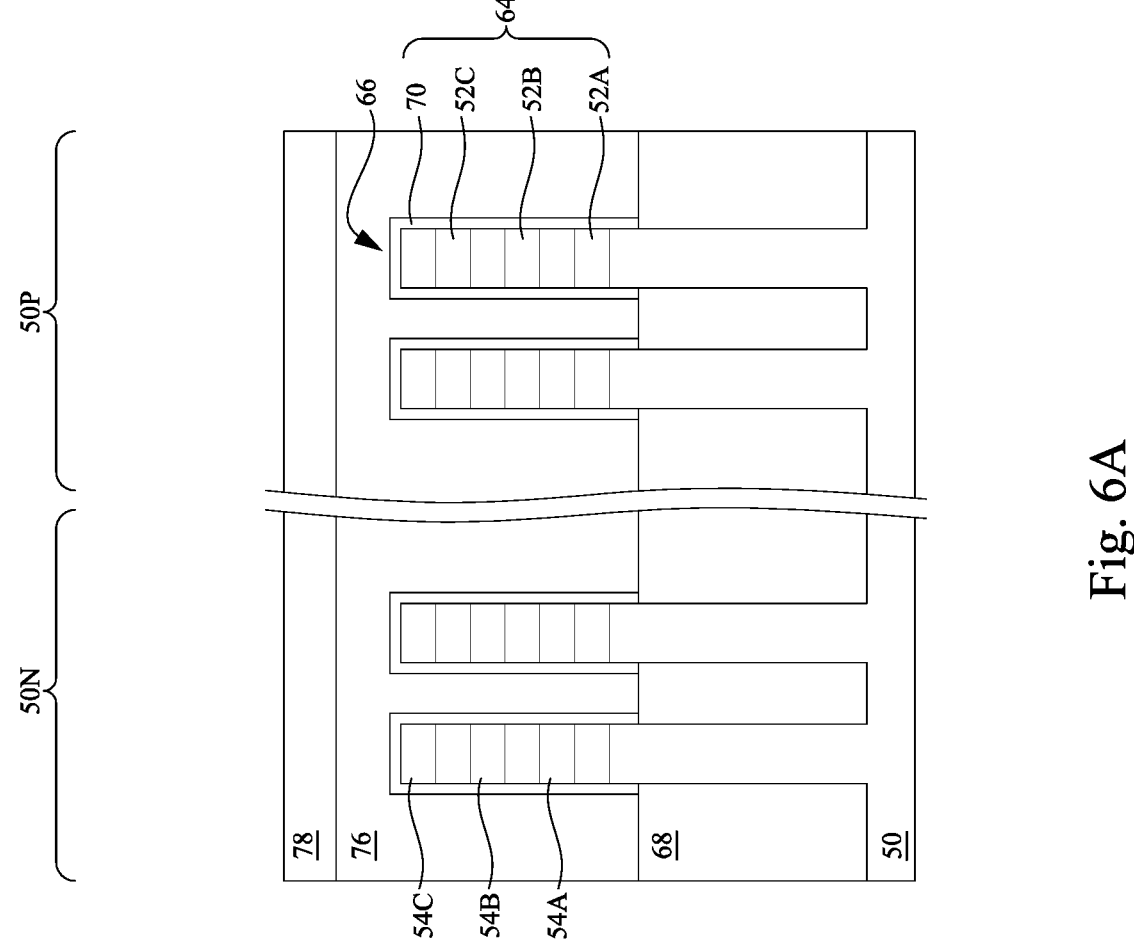
Figure 6B:
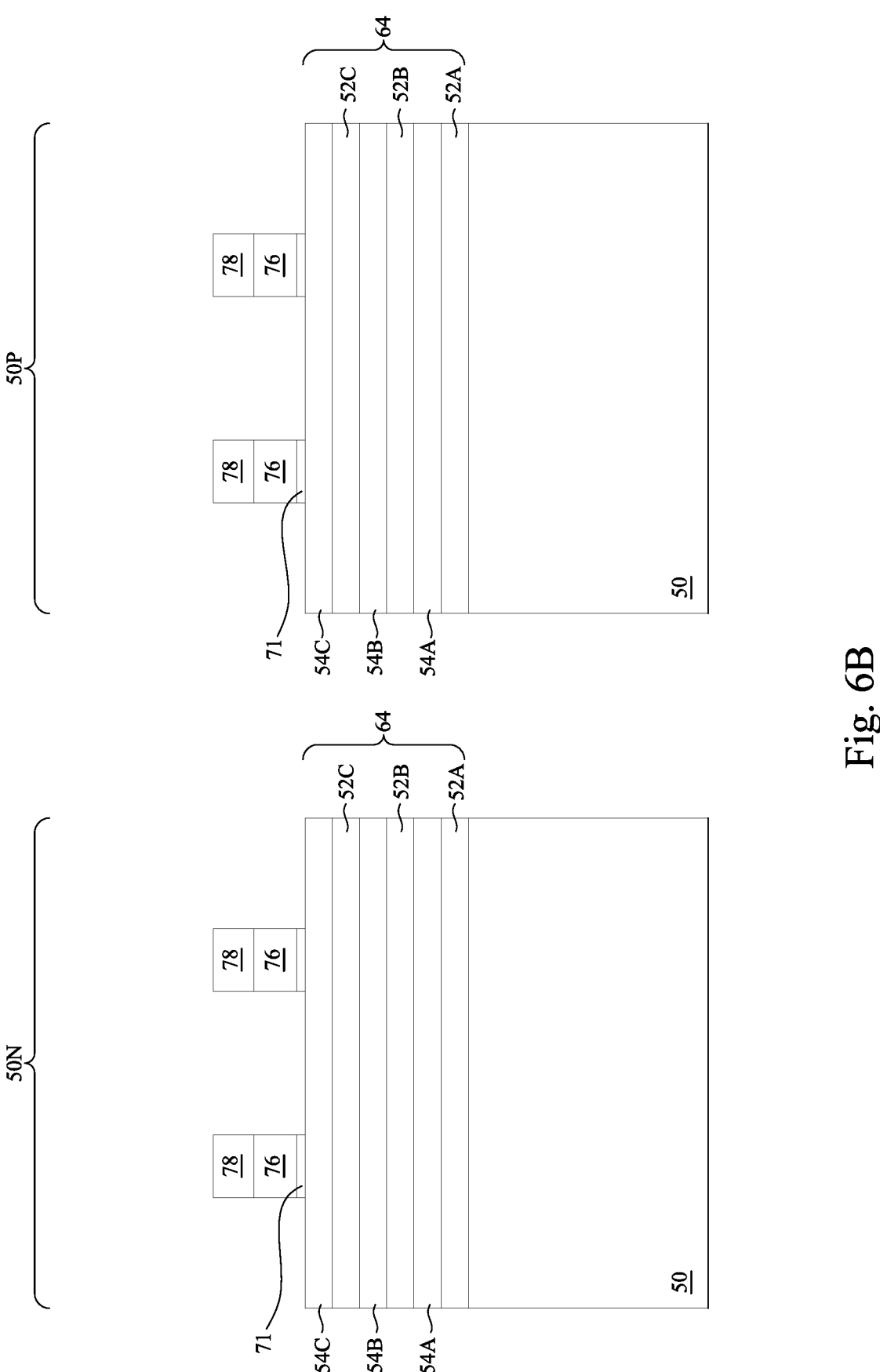

FIGS. 6A through 20D illustrate various additional steps in the manufacturing of embodiment devices. FIGS. 6A, 7A, 8A, 9A, 10A, 11A, 12A, 13A, 13C, 14A, 15A, 15C, 16A, 16C, 17A, 17C, 17D, 18A, 18C, 19A, 19C, 20A, and 20C illustrate features in either the n-type regions 50N or the p-type regions 50P. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7A:
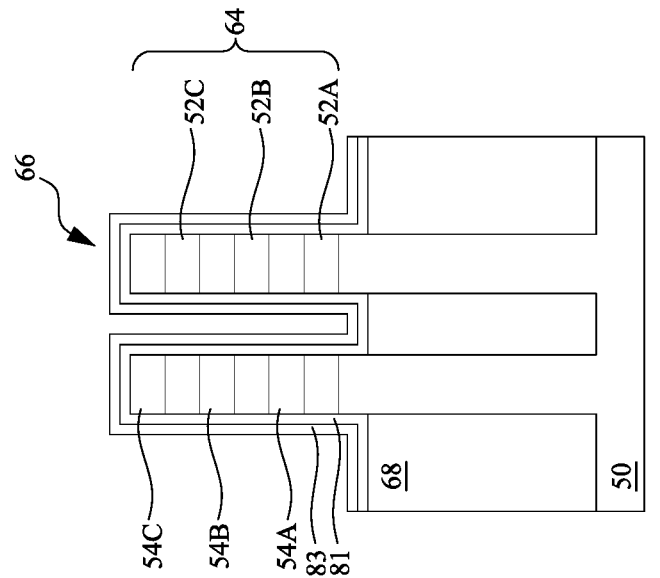
Figure 7B:
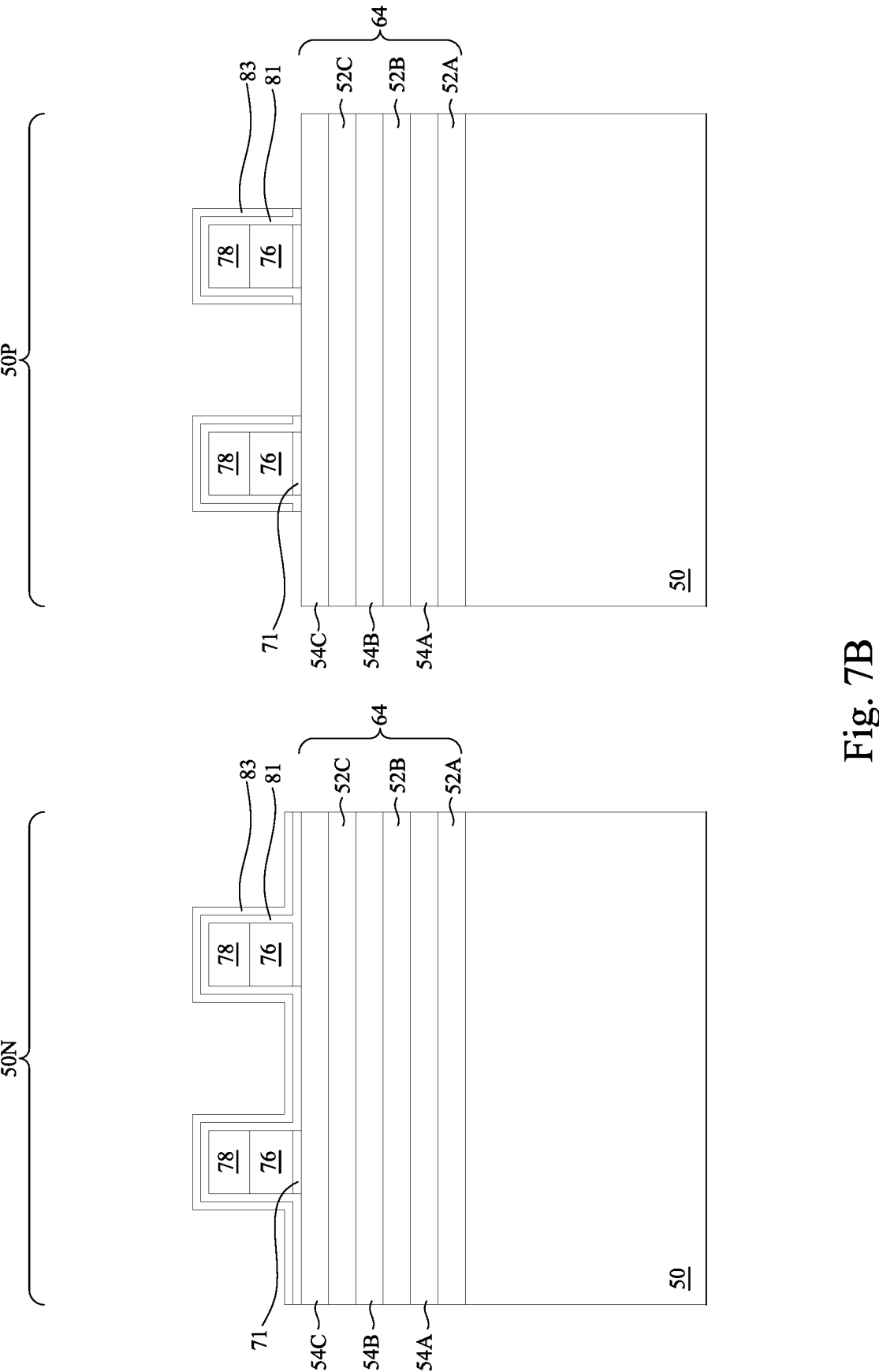

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68; top surfaces and side-walls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1 \times 10^{15}$ atoms/cm$^3$ to about $1 \times 10^{19}$ atoms/cm$^3$. An anneal may be used to repair implant damage and to activate the implanted impurities.

Figure 8A:
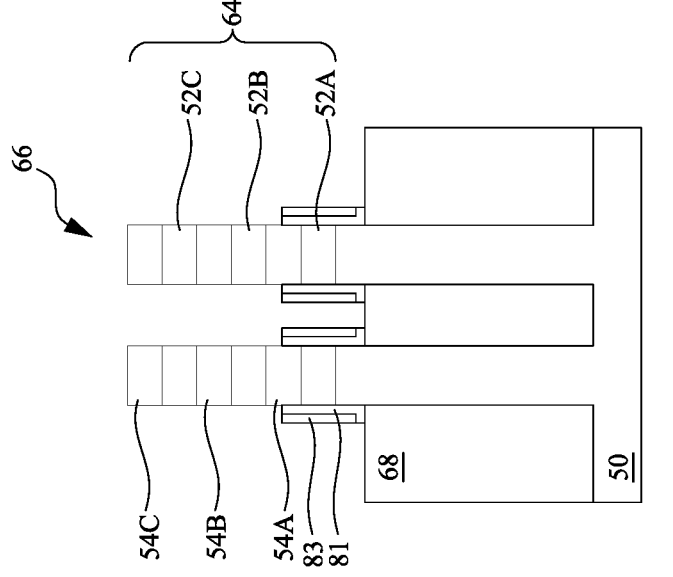
Figure 8B:
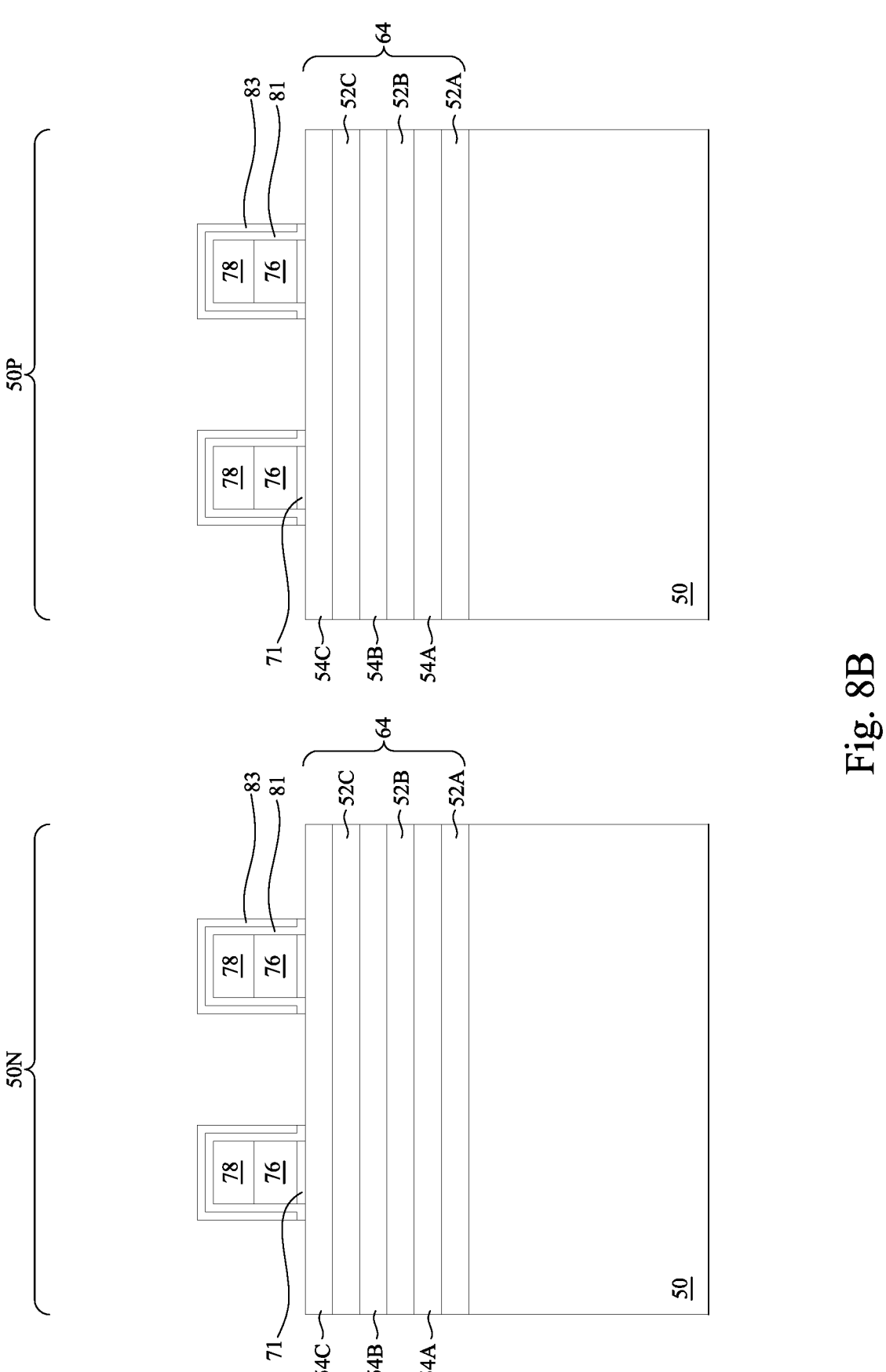

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-align subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81 as illustrated in FIG. 8A. Although not specifically illustrated in FIG. 8B, in accordance with some embodiments, the etch process (e.g., the anisotropic etch process) may additionally remove the first spacer layer 80 and the second spacer layer 82 from over the top of the masks 78 as well as the second spacer layer 82 from the lateral sides of the dummy gates 76 and the masks 78.

As illustrated in FIG. 8A, the first spacers 81 and the second spacers 83 are disposed on sidewalls of the fins 66 and/or nanostructures 55. As illustrated in FIG. 8B, portions of the first spacer 81 and the second spacer 83 may remain adjacent and over the masks 78, the dummy gates 76, and the dummy gate dielectrics 71. In other embodiments not specifically illustrated, the second spacer layer 82 may be removed from over the first spacer layer 80 adjacent and over a top of the masks 78, the dummy gates 76, and the dummy gate dielectrics 71, and the first spacer layer 80 may be removed from over the top of the masks 78.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9A:
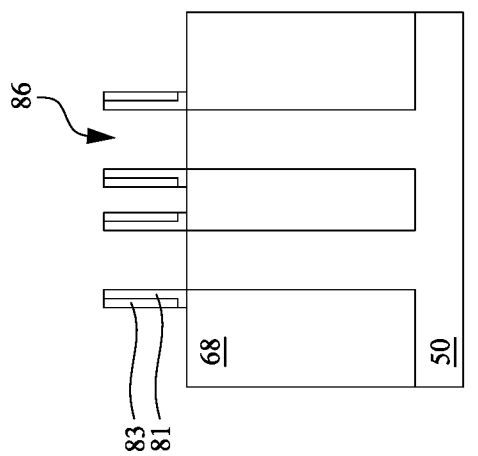
Figure 9B:
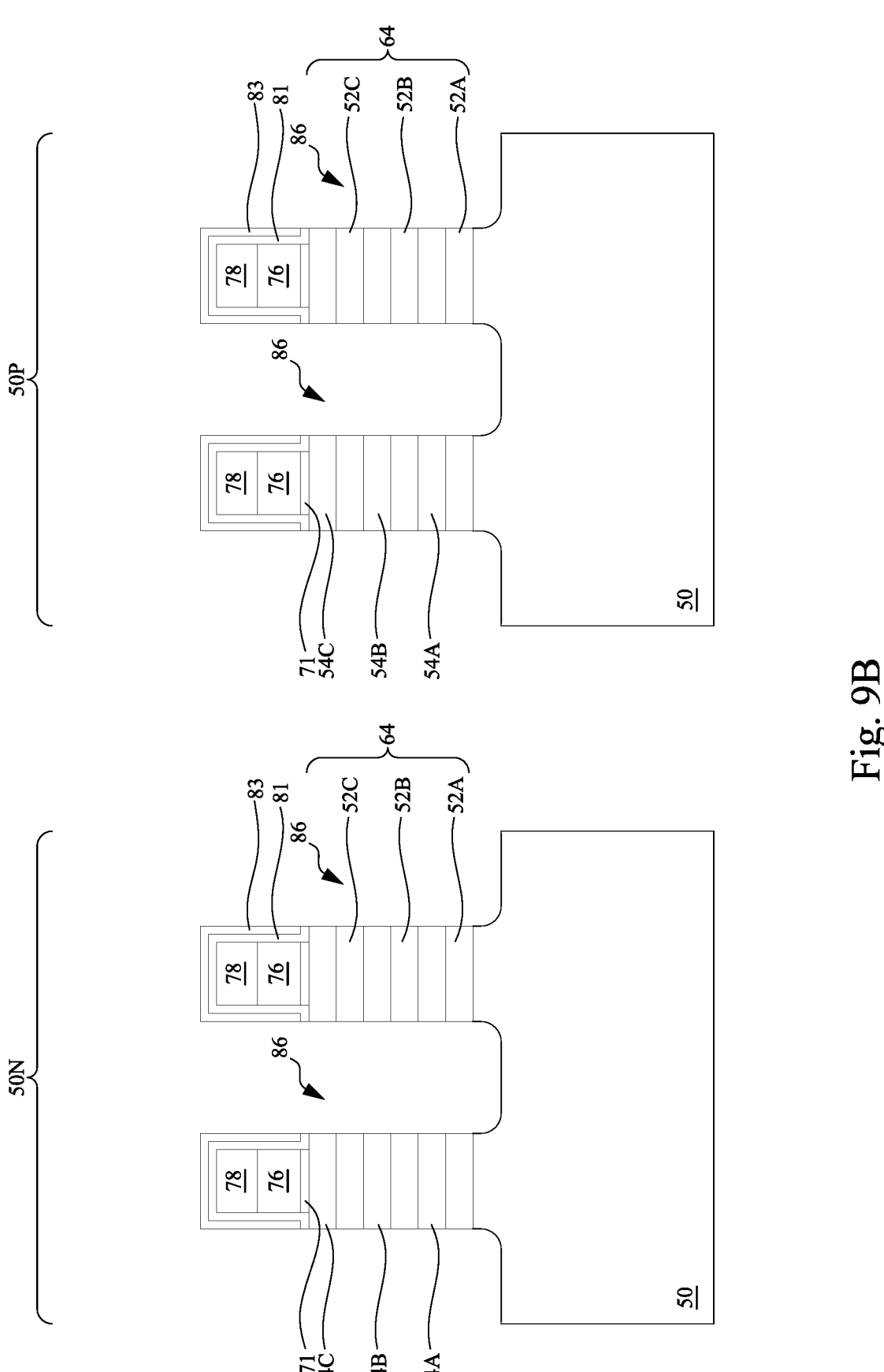

In FIGS. 9A and 9B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the STI regions 68 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Figure 10A:
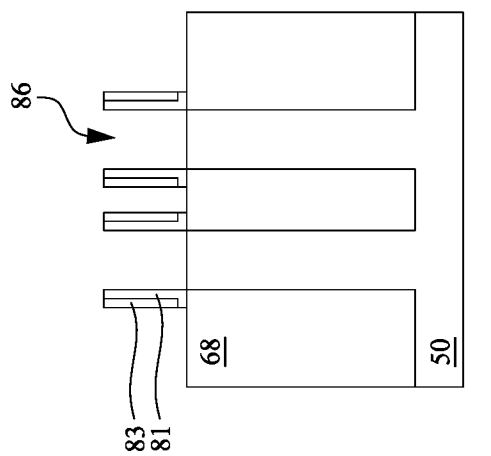
Figure 10B:
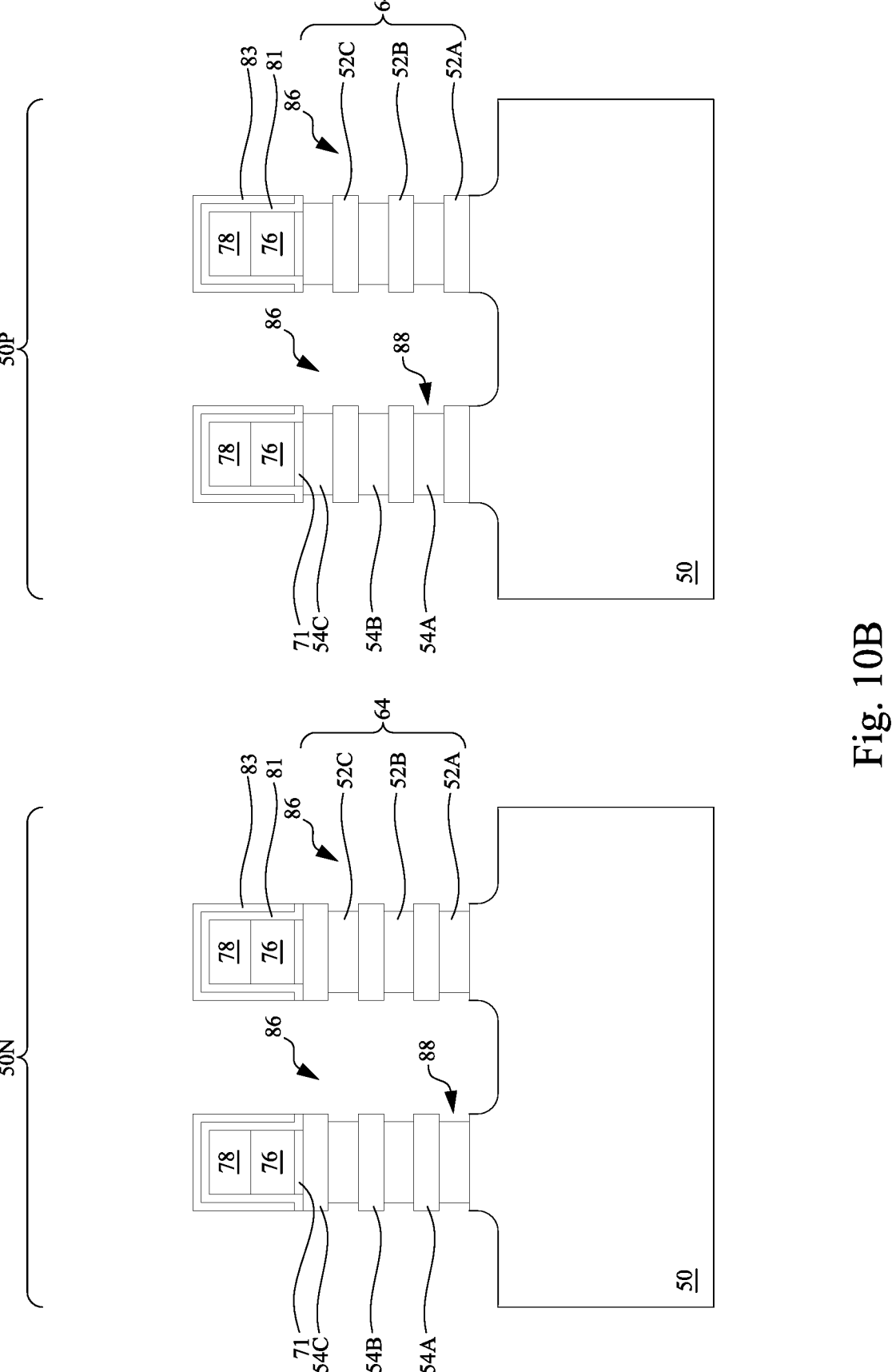

In FIGS. 10A and 10B, portions of sidewalls of the layers of the multi-layer stack 64 formed of the first semiconductor materials (e.g., the first nanostructures 52) exposed by the first recesses 86 are etched to form sidewall recesses 88 in the n-type region 50N, and portions of sidewalls of the layers of the multi-layer stack 64 formed of the second semiconductor materials (e.g., the second nanostructures 54) exposed by the first recesses 86 are etched to form sidewall recesses 88 in the p-type region 50P. Although sidewalls of the first nanostructures 52 and the second nanostructures 54 in the sidewall recesses 88 are illustrated as being straight in FIG. 10B, the sidewalls may be concave or convex. The sidewalls may be etched using isotropic etching processes, such as wet etching or the like. The p-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the n-type region 50N. Similarly, the n-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the p-type region 50P. In an embodiment in which the first nanostructures 52 include, for example, SiGe, and the second nanostructures 54 include, for example, Si or SiC, a dry etch process with tetramethylammonium hydroxide (TMAH), ammonium hydroxide ($NH_4OH$), or the like may be used to etch sidewalls of the first nanostructures 52 in the n-type region 50N, and a dry etch process with hydrogen fluoride, another fluorine-based etchant, or the like may be used to etch sidewalls of the second nanostructures 54 in the p-type region 50P.

Figure 11A:
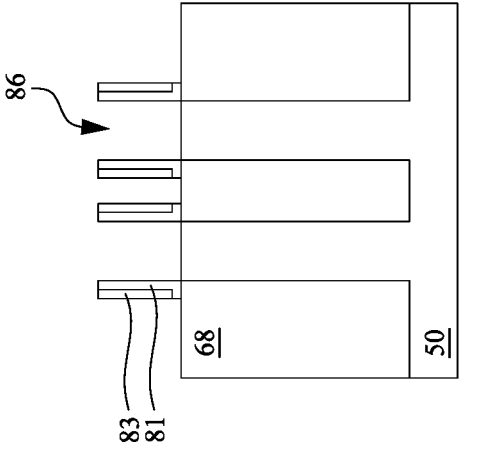
Figure 11B:
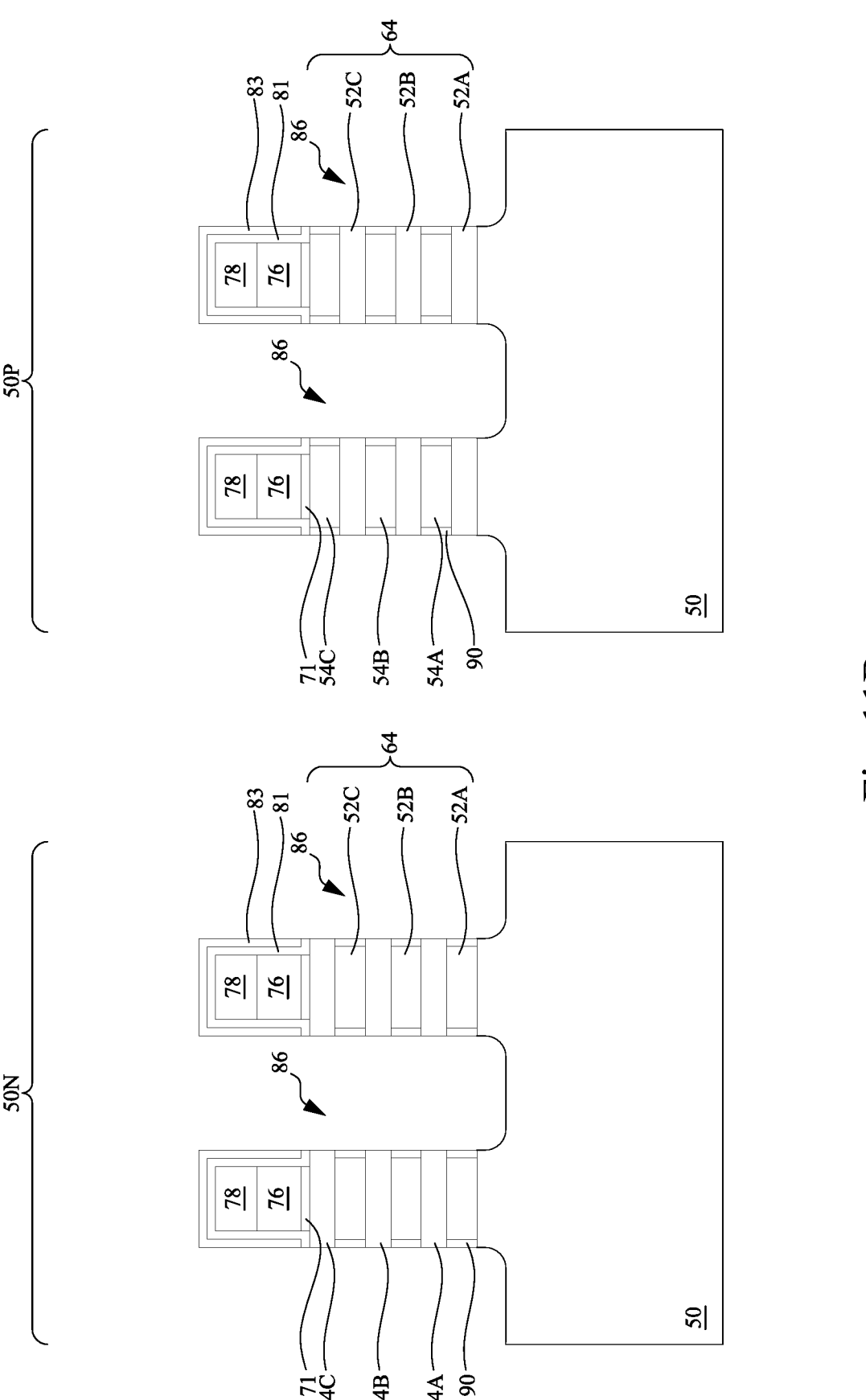

In FIGS. 11A-11B, first inner spacers 90 are formed in the sidewall recess 88. The first inner spacers 90 may be formed by depositing an inner spacer layer (not separately illustrated) over the structures illustrated in FIGS. 10A and 10B. The first inner spacers 90 act as isolation features between subsequently formed source/drain regions and a gate structure. As will be discussed in greater detail below, source/drain regions will be formed in the first recesses 86, while the first nanostructures 52 in the n-type region 50N and the second nanostructures 54 in the p-type region 50P will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. The first inner spacers 90 may be used to prevent damage to subsequently formed source/drain regions (such as the epitaxial source/drain regions 92, discussed below) by subsequent etching processes, such as etching processes used to form gate structures. Although outer sidewalls of the first inner spacers 90 are illustrated as being flush with sidewalls of the second nanostructures 54 in the n-type region 50N and flush with the sidewalls of the first nanostructures 52 in the p-type region 50P, the outer sidewalls of the first inner spacers 90 may extend beyond or be recessed from sidewalls of the second nanostructures 54 and/or the first nanostructures 52, respectively.

In FIGS. 12A-19C, epitaxial source/drain regions 92 are formed in the first recesses 86. In particular, FIGS. 12A-15C illustrate forming epitaxial source/drain regions 92 in the n-type region 50N, and FIGS. 16A-19C illustrate forming epitaxial source/drain regions 92 in the p-type region 50P. In some embodiments, the epitaxial source/drain regions 92 may exert stress on the second nanostructures 54 in the n-type region 50N and on the first nanostructures 52 in the p-type region 50P, thereby improving performance. As illustrated, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

Figure 12A:
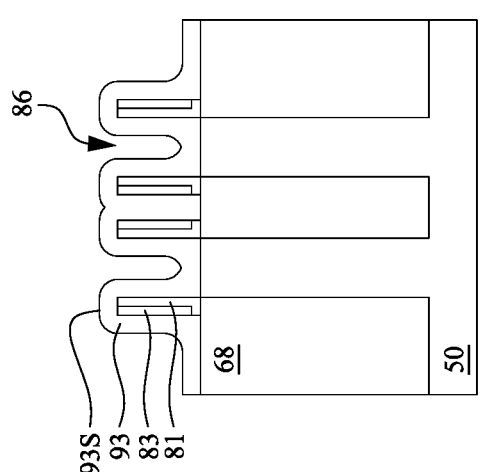
Figure 12B:
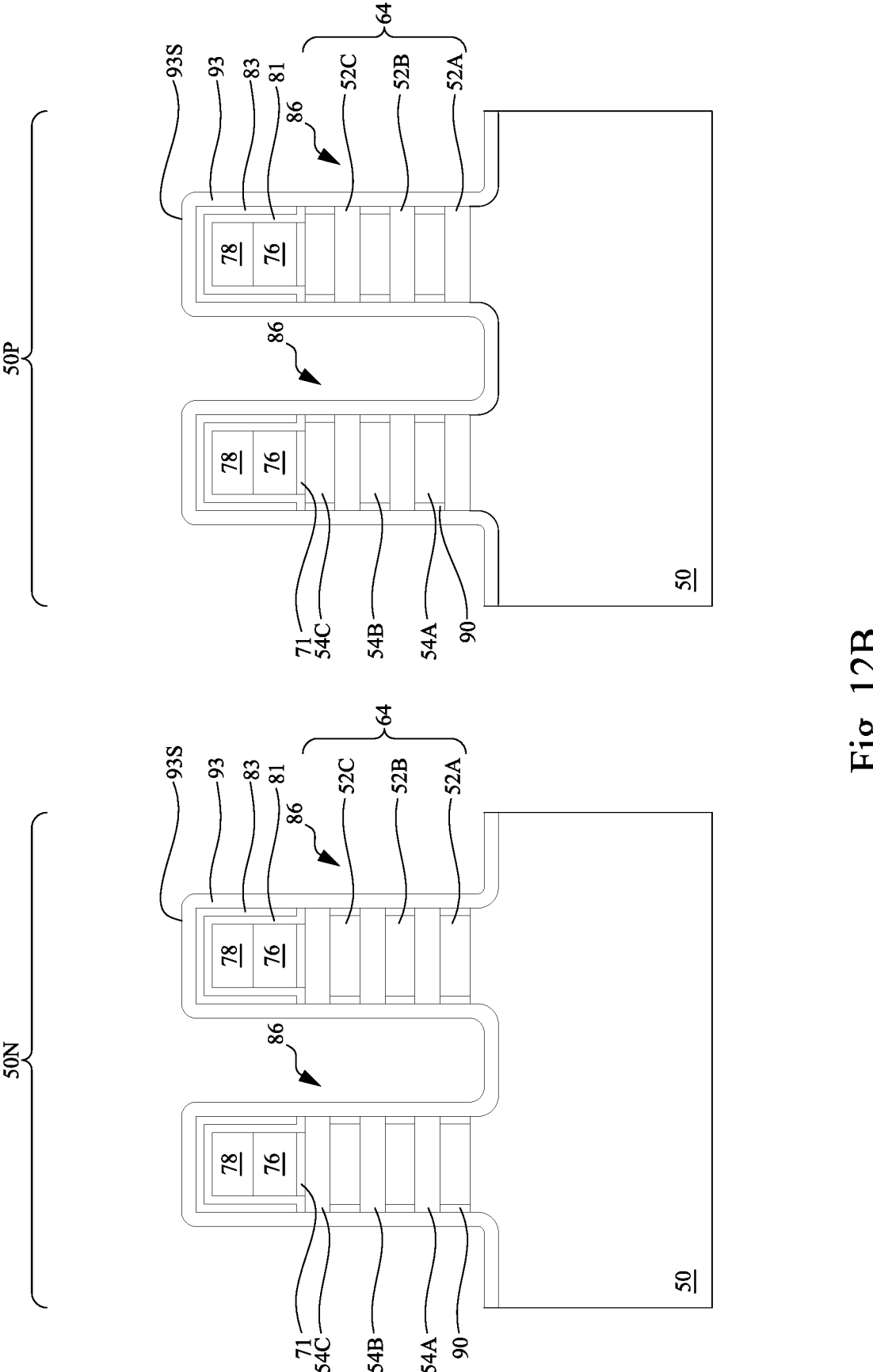

Referring to FIGS. 12A-12B, a p-masking layer 93 is formed over the structure (e.g., the n-type region 50N and the p-type region 50P). The p-masking layer 93 will protect the p-type region 50P during formation of n-type epitaxial source/drain regions 92 in the first recesses 86 of the n-type region 50N (e.g., the NMOS region). The p-masking layer 93 may be deposited by a conformal deposition process, such as ALD, CVD, or the like. The p-masking layer 93 may comprise a material such as a metal oxide, including aluminum oxide, hafnium oxide, zirconium oxide, titanium oxide, zinc oxide, or the like. Using a metal oxide as the p-masking layer 93 allows for a thin p-masking layer 93, which advantageously protects substrates by providing full coverage even when features such as the first recesses 86 have very small critical dimensions. Following deposition, the p-masking layer 93 may have a substantially smooth exposed surface 93S and be substantially or entirely amorphous. For example, in some embodiments the p-masking layer 93 may be deposited to a thickness of between about 1 nm and about 10 nm, a density of between about 2.6 g/cm$^3$ and about 4.0 g/cm$^3$, and a roughness of between about 0.1 nm and about 0.8 nm.

Figure 13A:
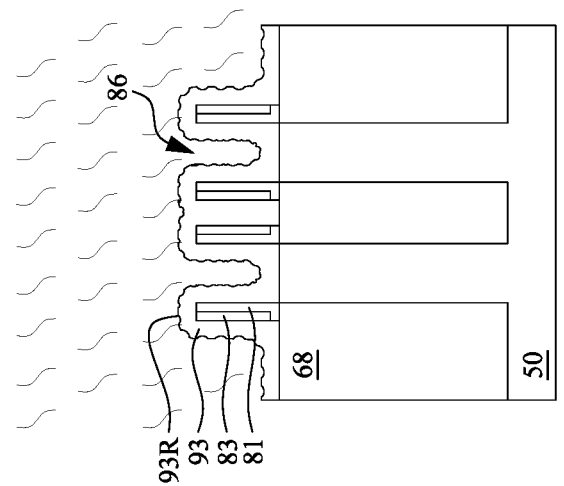
Figure 13B:
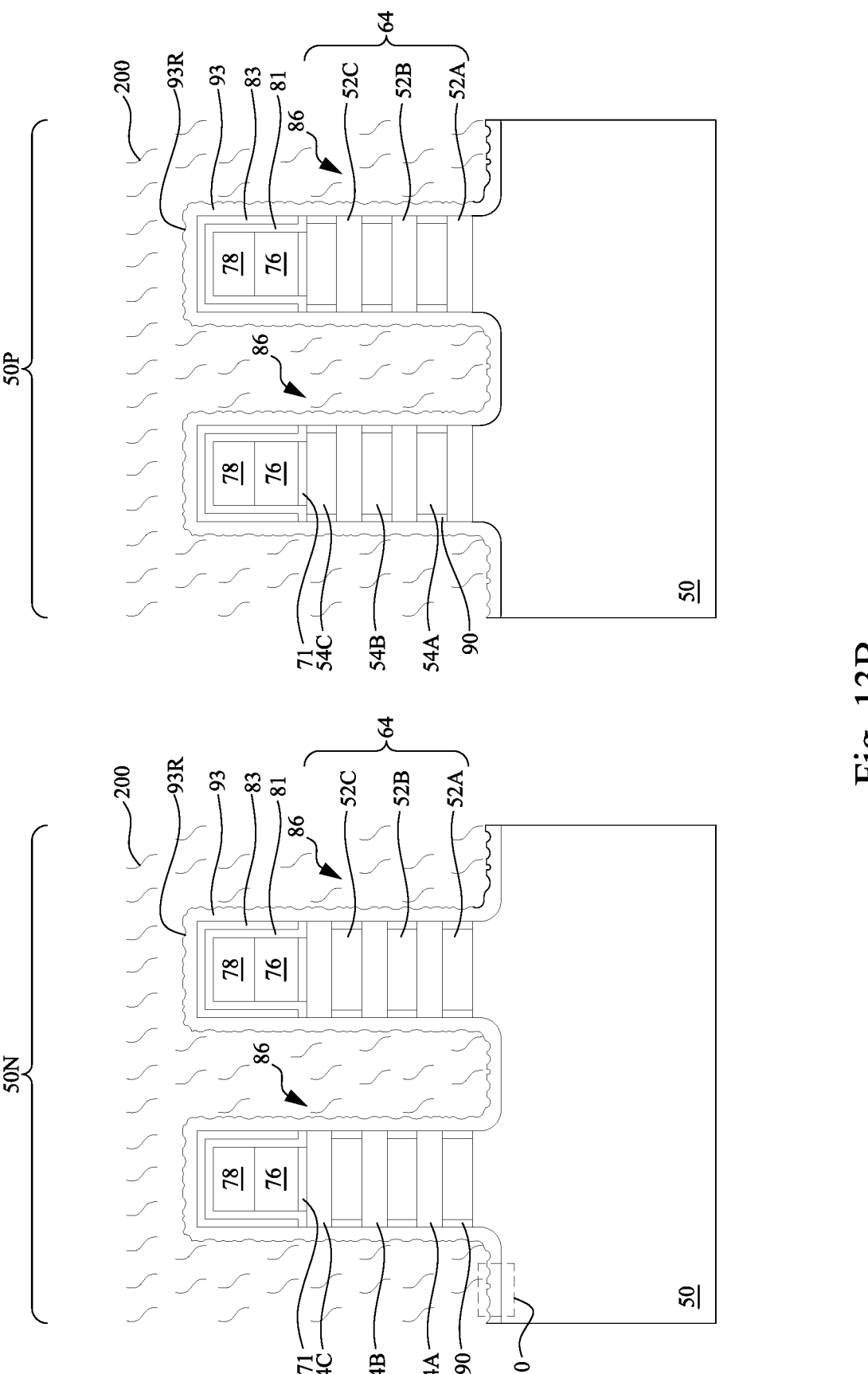
Figure 13C:
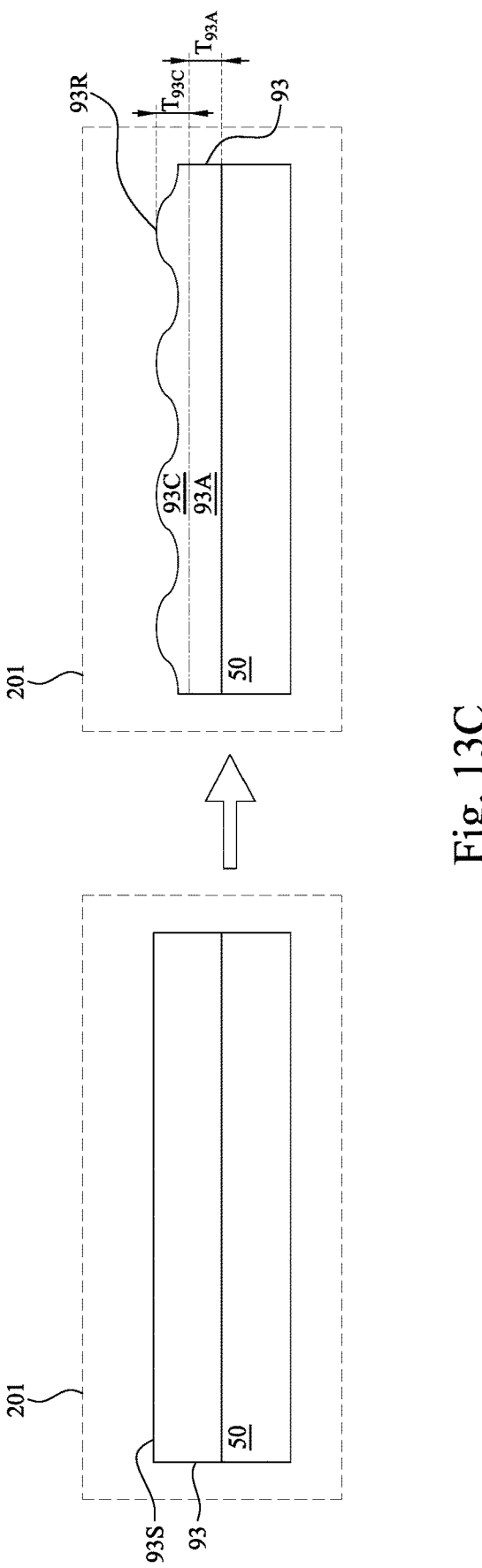

Referring to FIGS. 13A-13C, after the deposition, a post-deposition treatment 200 (or a roughening treatment 200) may be performed on the p-masking layer 93. The post-deposition treatment 200 stabilizes the p-masking layer 93 to form a denser layer. As a result, the p-masking layer 93 may have a more contoured, or rougher, exposed surface 93R instead of the previously smooth exposed surface 93S. The more contoured (or rougher) shape of the exposed surface 93R improves selectivity during epitaxial growth in subsequent steps (see FIGS. 15A-15C) because the epitaxy grows less easily and in smaller nodules on the rougher surface 93R of the p-masking layer 93. Less growth of the epitaxy over the p-masking layer 93 also allows for more efficient removal of the p-masking layer 93 (see FIG. 16A-16C) following formation of the epitaxial source/drain regions 92 in the n-type region 50N.

The post-deposition treatment 200 may comprise a thermal treatment, plasma treatment, UV treatment, microwave treatment, plasma bombardment, implantation, reticle absorption treatment, electron annealing, radiation annealing, the like, or any combination thereof. In accordance with some embodiments, the post-deposition treatment 200 may comprise a thermal treatment that comprises annealing for a duration of between about 30 minutes and about 8 hours at a temperature greater than about 650° C., including temperatures between about 650° C. and about 900° C. The thermal treatment may be performed in an ambient of nitrogen, argon, helium, hydrogen, or the like. The p-masking layer 93 may become thinner as some or all of the p-masking layer 93 crystallizes and/or densifies during the post-deposition treatment 200. Following the post-deposition treatment 200, the p-masking layer 93 may have a thickness of between about 0.5 nm and about 6 nm, a density of between about 2.8 g/cm$^3$ and about 4.2 g/cm$^3$, and a roughness of between about 2 nm and about 5 nm.

Referring to FIG. 13C illustrating a zoomed-in view of region 201 of FIG. 13B, the post-deposition treatment 200 may partially or completely convert an amorphous p-masking layer 93 into crystalline form. Note that the illustrated region 201 depicts a portion of the p-masking layer 93 that is representative of any or all other portions of the p-masking layer 93 disposed over the structures. For example, an upper portion of the p-masking layer 93 may comprise a crystalline layer 93C, while a lower portion of the p-masking layer 93 may remain a substantially amorphous layer 93A. The crystalline layer 93C may have a thickness $T_{93C}$ of between about 2 nm and about 5 nm, and the amorphous layer 93A may have a thickness $T_{93A}$ of between about 2 nm and about 5 nm.

In addition or alternatively, the post-deposition treatment 200 may comprise a plasma treatment. During the plasma treatment, the surface 93S of the p-masking layer 93 is exposed to a plasma of nitrogen, argon, ammonia, oxygen, helium, the like, or a combination thereof, to alter the material properties and/or etch portions of the p-masking layer 93. The plasma treatment may be performed for a duration of between about 10 seconds to about 10 minutes, at a temperature of between about 50° C. and about 500° C., and at a pressure of between about 0.5 Torr and about 10 Torr.

The post-deposition treatment 200 may further comprise a UV radiation treatment. During the UV radiation treatment, the surface 93S of the p-masking layer 93 is exposed to UV radiation in an ambient of nitrogen, argon, ammonia, oxygen, helium, the like, or any combinations thereof, to alter the material properties and/or etch portions of the p-masking layer 93. The UV radiation treatment may be performed for a duration of between about 30 seconds to about 10 minutes at an energy of between about 50 Watts and about 1000 Watts.

In addition or alternatively, the post-deposition treatment 200 may comprise a microwave radiation treatment. During the microwave radiation treatment, the surface 93S of the p-masking layer 93 is exposed to microwave radiation in an ambient of nitrogen, argon, ammonia, oxygen, helium, the like, or any combinations thereof, to alter the material properties and/or etch portions of the p-masking layer 93. The microwave radiation treatment may be performed for a duration of between about 30 seconds and about 10 minutes at an energy of between about 500 Watts and about 3000 Watts.

In accordance with some embodiments, the post-deposition treatment 200 may comprise a combination of one or more of the above-described treatment processes. For example, the post-deposition treatment 200 may comprise a thermal treatment in combination with a plasma treatment, whether performed simultaneously or in succession. In other embodiments, the post-deposition treatment 200 may comprise a thermal treatment, a plasma treatment, and a UV radiation treatment, whether two or all are performed simultaneously or all three in succession.

Figure 14A:
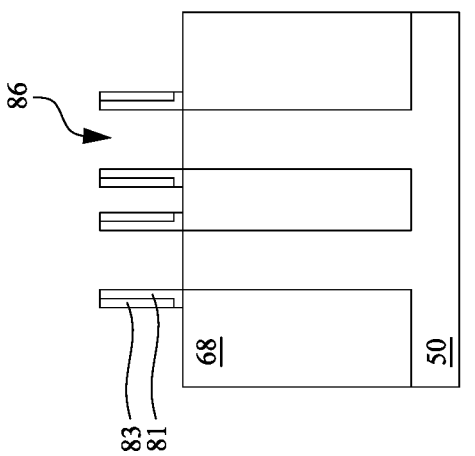
Figure 14B:
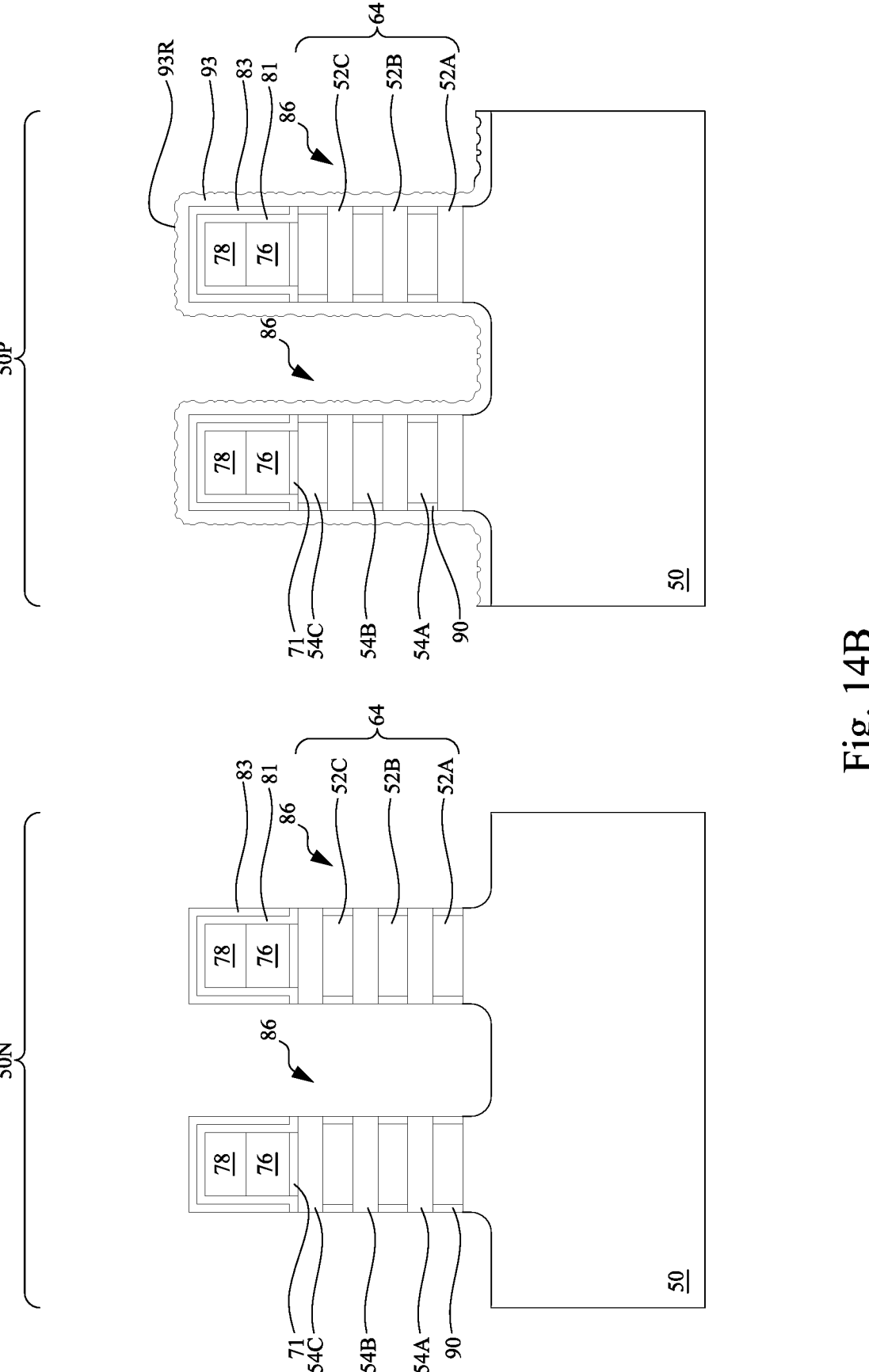

Referring to FIGS. 14A-14B, after the post-deposition treatment 200, the p-masking layer 93 is removed from the n-type region 50N. A photoresist (not specifically illustrated), such as a hardmask, may be formed over the p-masking layer 93 and patterned to expose the p-masking layer 93 in the n-type region 50N. The p-masking layer 93 may then be etched using a suitable etching process, such as an isotropic etching process (e.g., a wet etching process), an anisotropic etching process (e.g., a dry etching process), or the like. The photoresist may then be removed by a suitable process, such as an isotropic etching process or an anisotropic etching process. In other embodiments, the p-masking layer 93 is removed in the n-type region 50N by one of the above processes without first forming the photoresist over the p-masking layer 93.

Figure 15A:
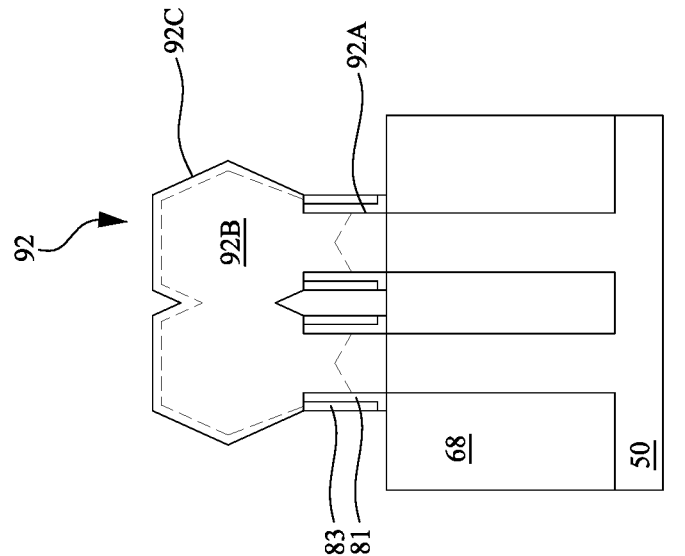
Figure 15B:
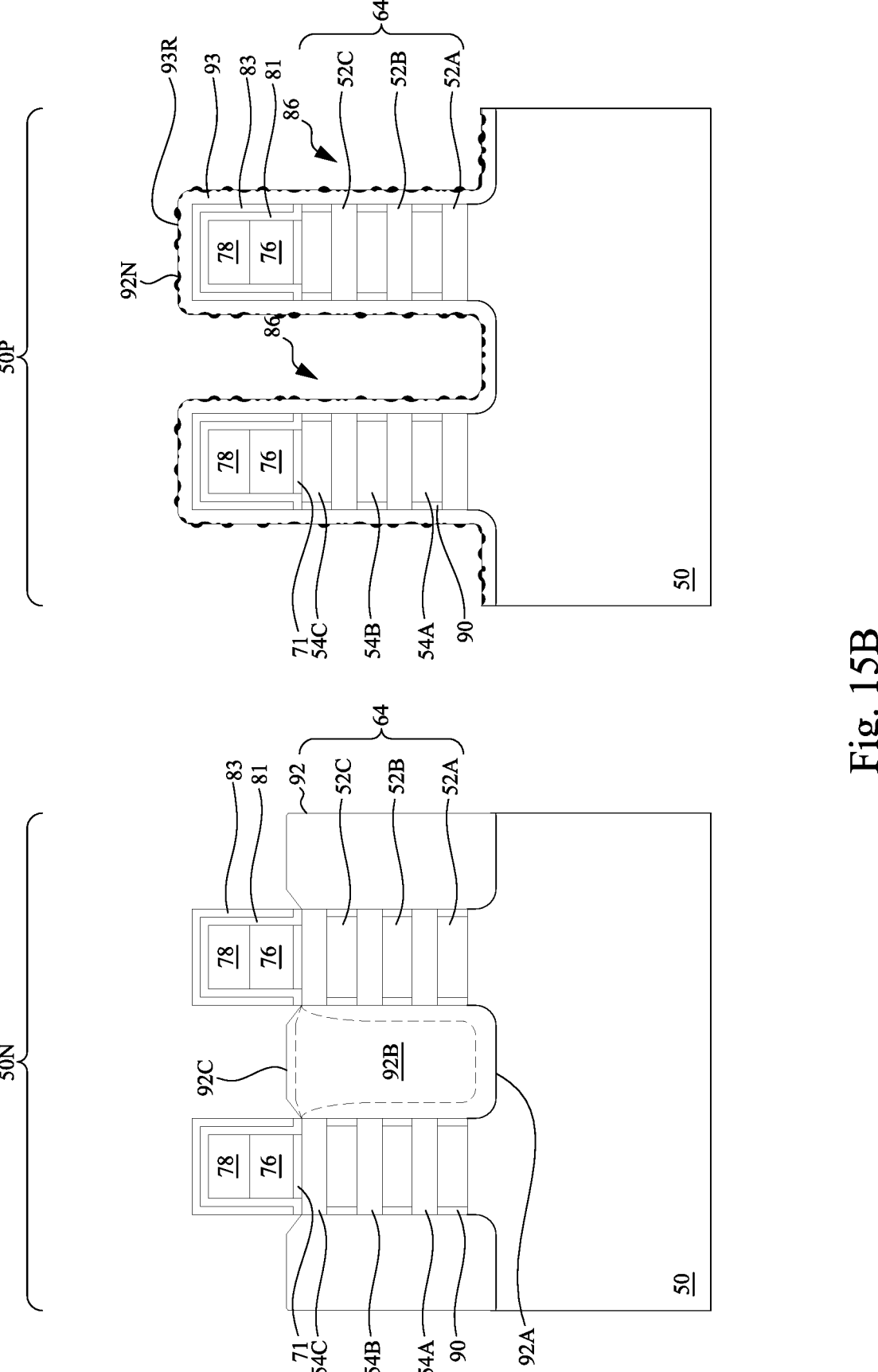
Figure 15C:
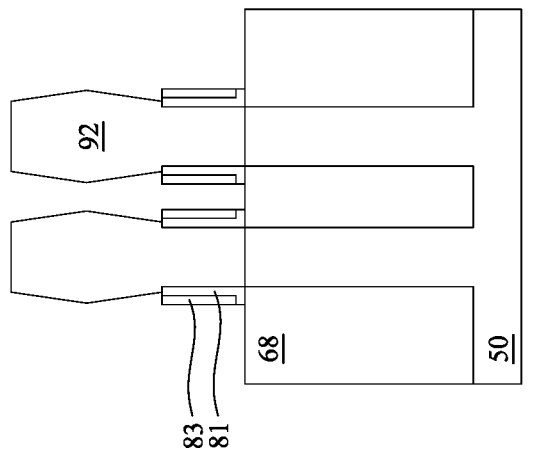

Referring to FIGS. 15A-15C, the epitaxial source/drain regions 92 are epitaxially grown in the first recesses 86 in the n-type region 50N, and nodules 92N of epitaxial material may form over the p-masking layer 93. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

As stated above, nodules 92N (e.g., small amounts of the epitaxy) may grow over the p-masking layer 93. However, the rough surface 93R of the p-masking layer 93 reduces the number and size of the nodules 92N that may otherwise form, which allows for greater control of the formation of the epitaxial source/drain regions 92 and improves removal of the p-masking layer 93 (and nodules 92N) in subsequent steps discussed in greater detail below. As illustrated, each of the epitaxial source/drain regions 92 forms to become one continuous material, while the nodules 92N form as discontinuous clusters or nodules.

The epitaxial source/drain regions 92, the first nanostructures 52, the second nanostructures 54, and/or the substrate 50 may be implanted with dopants to form source/drain regions, similarly to the processes previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type impurities for source/drain regions may be any of the impurities previously discussed. The n-type impurities may be implanted while the p-masking layer 93 remains protecting the p-type region 50P. In some embodiments, the epitaxial source/drain regions 92 may be in situ doped during growth.

As a result of the epitaxy processes used to form the epitaxial source/drain regions 92, upper surfaces of the epitaxial source/drain regions 92 have facets which expand laterally outward beyond sidewalls of the nanostructures 55. In some embodiments, these facets cause adjacent epitaxial source/drain regions 92 of a same NSFET to merge as illustrated by FIG. 15A. In other embodiments, adjacent epitaxial source/drain regions 92 remain separated after the epitaxy process is completed as illustrated by FIG. 15C. In the embodiments illustrated in FIGS. 15A and 15C, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

In FIGS. 16A-19C, the p-masking layer 93 and the nodules 92N may be removed from the p-type region 50P, and the epitaxial source/drain regions 92 in the p-type region 50P (e.g., the PMOS region) may be formed in a similar way as described above in connection with the epitaxial source/drain regions 92 in the n-type region 50N.

Figure 16A:
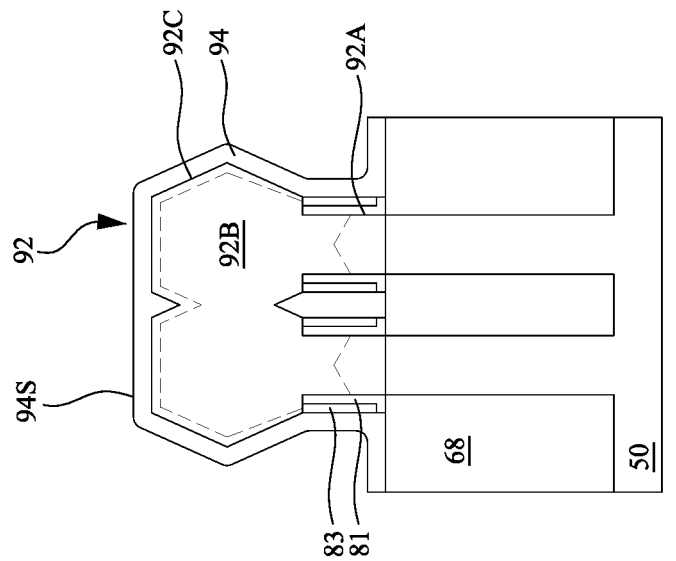
Figure 16B:
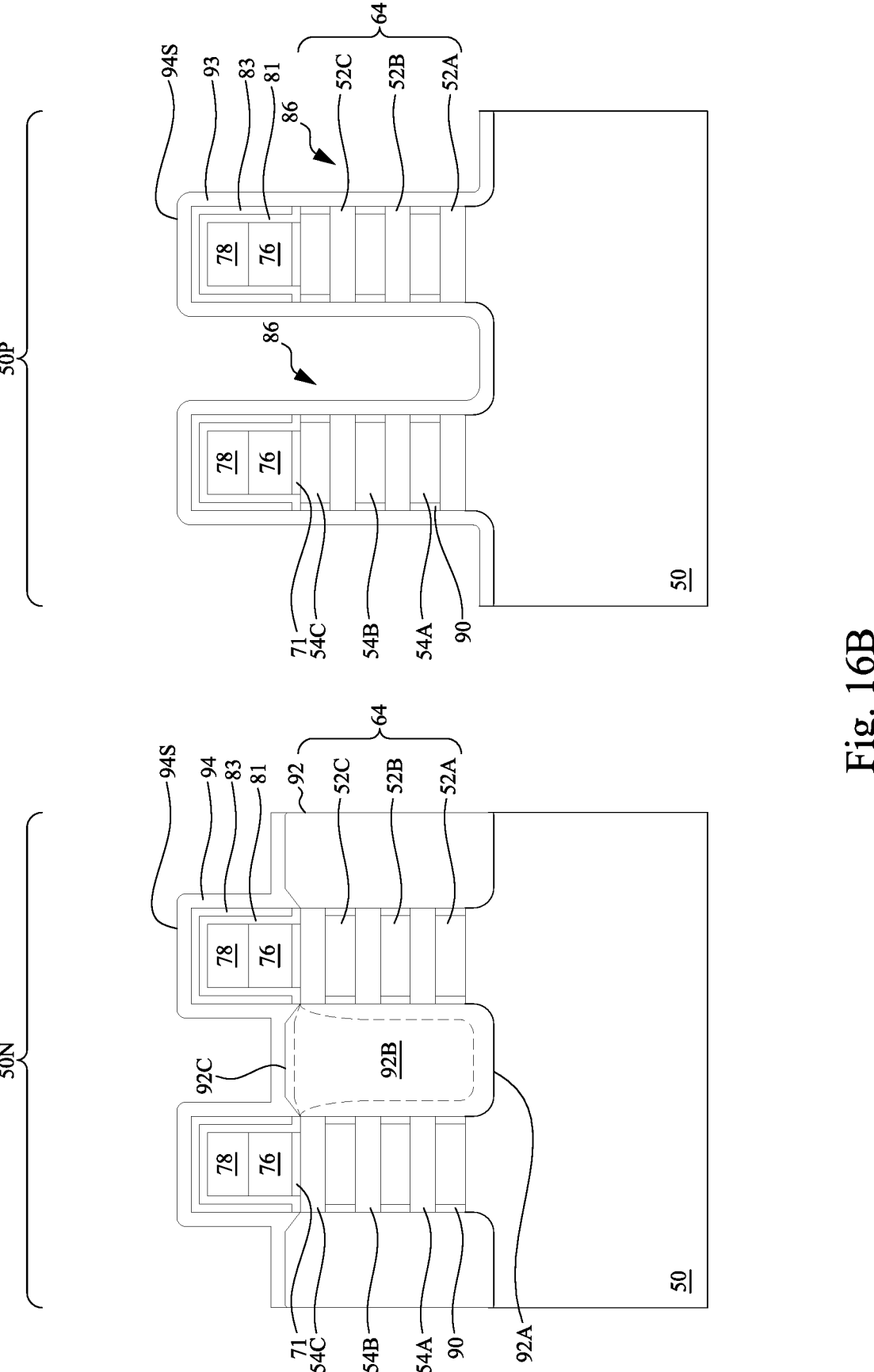
Figure 16C:
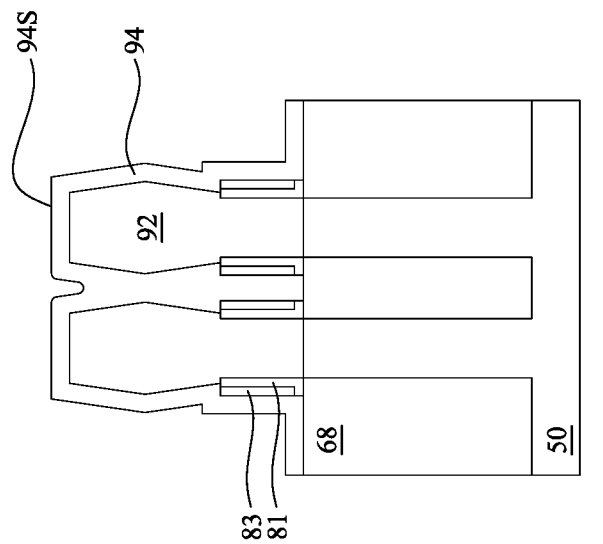

Referring to FIGS. 16A-16C, the p-masking layer 93 and the nodules 92N may be removed from the p-type region 50P. For example, the p-masking layer 93 and the nodules 92N may be removed using a wet or dry etch with etchants such as sulfuric acid ($H_2SO_4$), hydrogen fluoride (HF), hydrogen chloride (HCl), ammonia ($NH_3+H_2O$), the like, any combinations thereof, or any suitable etchants. The reduced size and number of the nodules 92N (due to the rough surface 93R of the p-masking layer 93) improve efficiency of removing the p-masking layer 93 and the nodules 92N by the above-described process. An n-masking layer 94 may then be formed over the structure (e.g., the n-type region 50N and the p-type region 50P). The n-masking layer 94 protects the n-type region 50N during formation of p-type epitaxial source/drain regions 92 in the first recesses 86 of the p-type region 50P (e.g., the PMOS region). The n-masking layer 94 may be deposited by a conformal deposition process, such as ALD, CVD, or the like. The n-masking layer 94 may comprise a material such as a metal oxide, including aluminum oxide, hafnium oxide ($HfO_2$), zirconium oxide ($ZrO_2$), or the like. The n-masking layer 94 may be the same or different from the p-masking layer 93, and may be formed by a similar or different process. Using a metal oxide as the n-masking layer 94 allows for a thin n-masking layer 94, which advantageously protects substrates by providing full coverage even when features such as the first recesses 86 have very small critical dimensions. Following deposition, the n-masking layer 94 may have a substantially smooth exposed surface 94S and be substantially or entirely amorphous. The n-masking layer 94 may become thinner and have a thickness of between about 1 nm and about 10 nm, a density of between about 2.6 g/cm$^3$ and about 4.0 g/cm$^3$, and a roughness of between about 0.1 nm and about 0.8 nm.

Referring to FIGS. 17A-17D, after the deposition, a post-deposition treatment 300 (or a roughening treatment 300) may be performed on the n-masking layer 94. As with the p-masking layer 93, the post-deposition treatment 300 stabilizes the n-masking layer 94 to form a denser layer. As a result, the n-masking layer 94 may have a more contoured, or rougher, exposed surface 94B instead of the previously smooth exposed surface 94S. As with the rougher exposed surface 93R of the p-masking layer 93, the rougher exposed surface 94R of the n-masking layer 94 improves selectivity during epitaxial growth in subsequent steps (see FIGS. 19A-19C) because the epitaxy grows less easily and in smaller nodules on the rougher surface 94R of the n-masking layer 94. Less growth of the epitaxy over the n-masking layer 94 also allows for more efficient removal of the n-masking layer 94 (see FIGS. 20A-20D) following formation of the epitaxial source/drain regions 92 in the p-type region 50P.

Any of the post-deposition treatments 200 described in connection with the p-masking layer 93 may be used for the post-deposition treatments 300 of the n-masking layer 94 (e.g., a thermal treatment, plasma treatment, UV treatment, microwave treatment, plasma bombardment, implantation, reticle absorption treatment, electron annealing, radiation annealing, the like, or any combination thereof). The post-deposition treatment 300 of the n-masking layer 94 may be a same or similar process as used in the post-deposition treatment 200 to the p-masking layer 93, or the processes may be different. In accordance with some embodiments, the post-deposition treatment 300 may comprise a thermal treatment that comprises annealing for a duration of between about 30 minutes and about 8 hours at a temperature greater than about 650° C., including temperatures between about 650° C. and about 900° C. The thermal treatment may be performed in an ambient of nitrogen, argon, helium, hydrogen, or the like. The n-masking layer 94 may become thinner as some or all of the n-masking layer 94 crystallizes and/or densifies during the post-deposition treatment 300. Following the post-deposition treatment 300, the n-masking layer 94 may have a thickness of between about 0.5 nm and about 6 nm, a density of between about 2.8 g/cm³ and about 4.2 g/cm³, and a roughness of between about 2 nm and about 5 nm.

For example, in some embodiments, both post-deposition treatments 200 and 300 may comprise a thermal treatment and/or a plasma treatment. In other embodiments, one of the post-deposition treatments 200 or 300 may comprise one type of treatment (e.g., a thermal treatment) while the other post-deposition treatment 200 or 300 comprises a different type of treatment (e.g., a plasma treatment). In other embodiments, one of the post-deposition treatments 200 or 300 may comprise one combination of treatments (e.g., a thermal treatment and a plasma treatment) while the other post-deposition treatment 200 or 300 comprises a single treatment or a different combination of treatments (e.g., a thermal treatment and a UV radiation treatment).

Figure 17A:
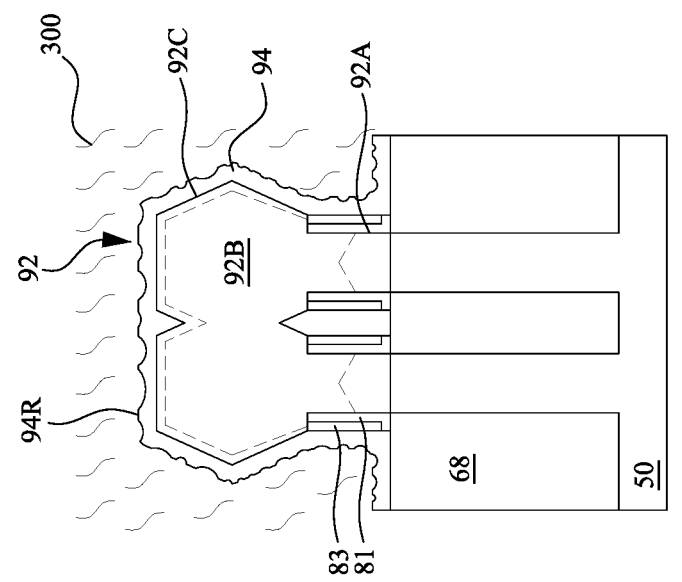
Figure 17B:
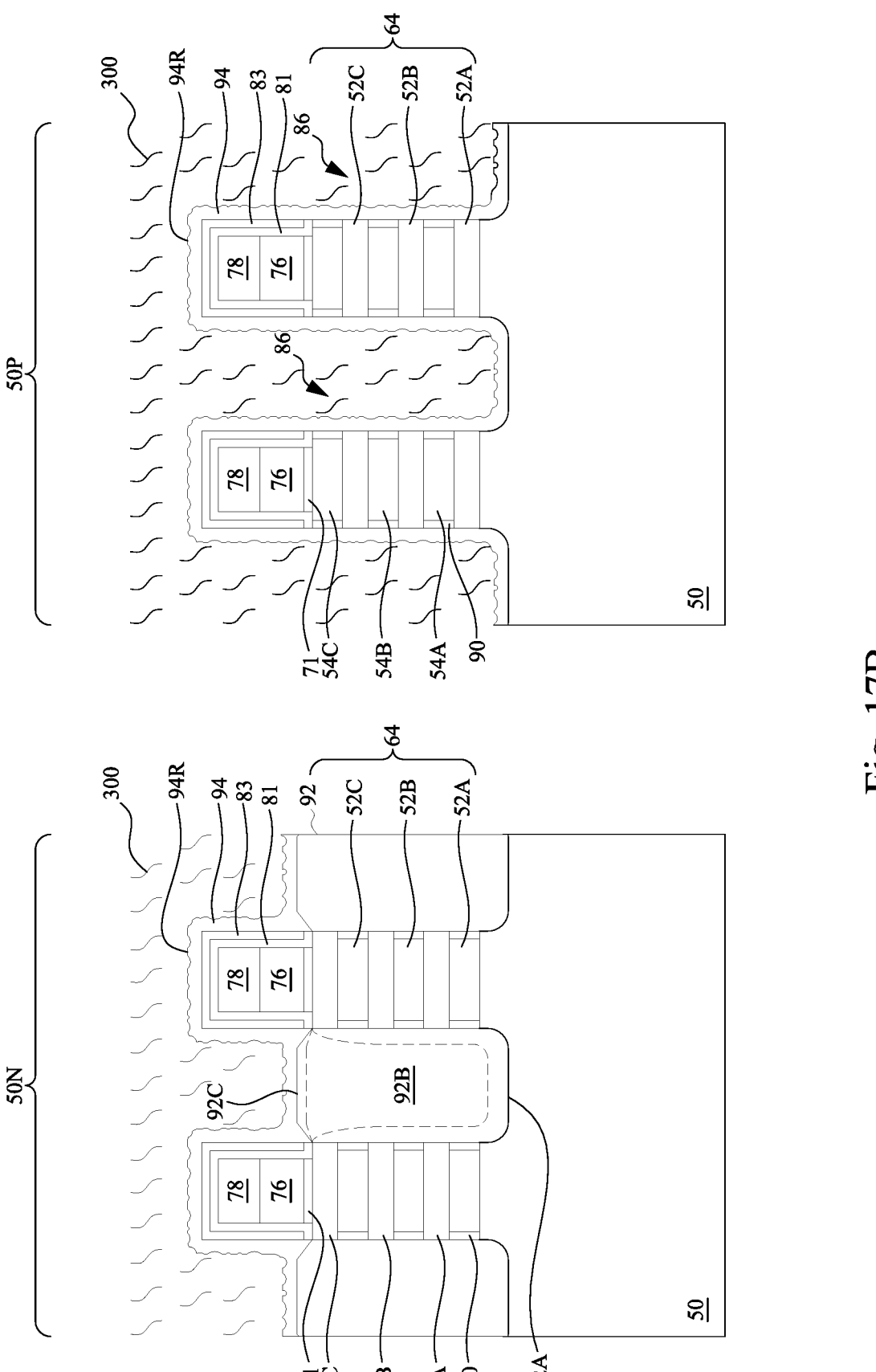
Figure 17C:
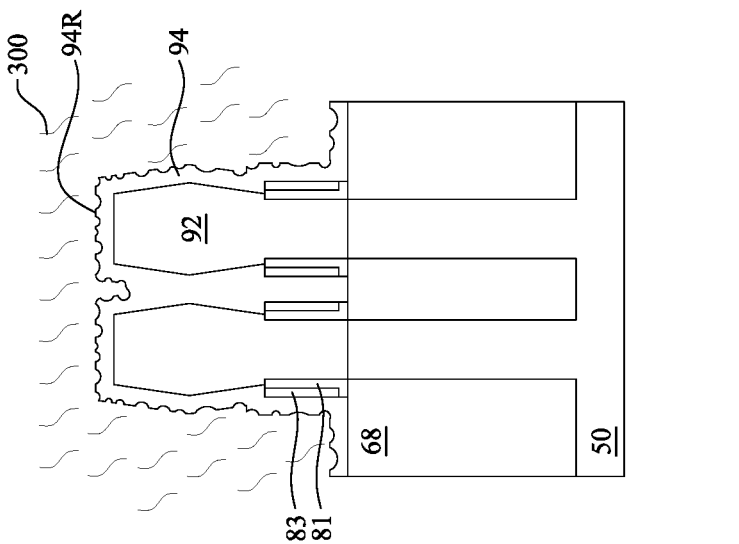
Figure 17D:
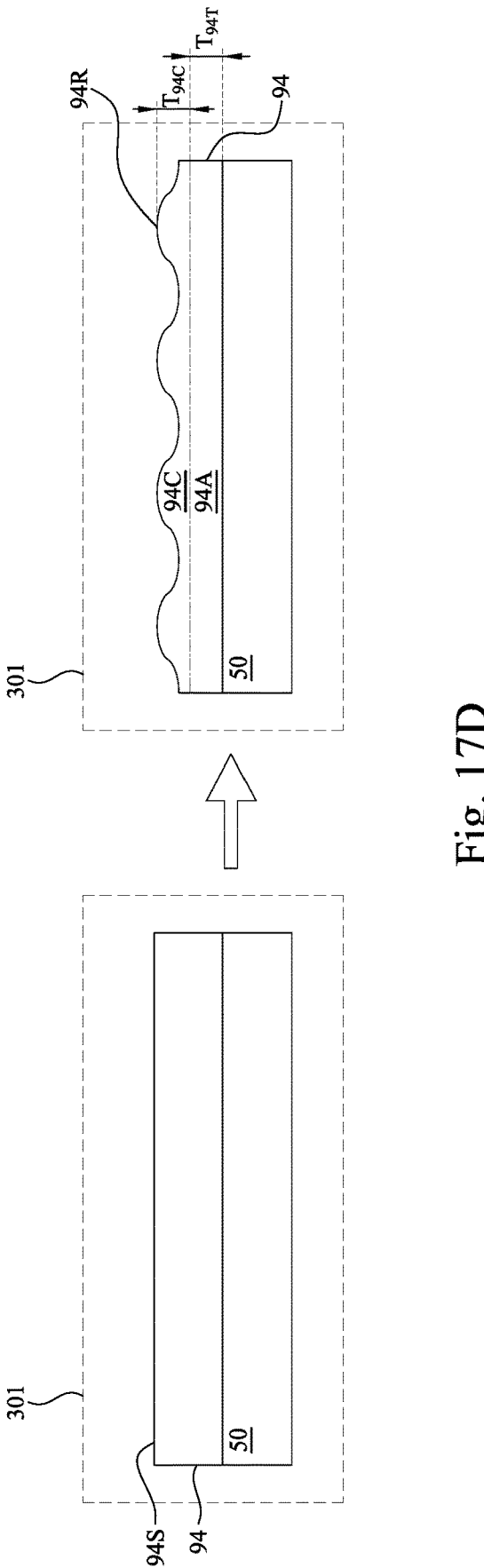

Referring to FIG. 17D illustrating a zoomed-in view of region 301 of FIG. 17B, the post-deposition treatment 300 may partially or completely convert an amorphous n-masking layer 94 into crystalline form. Note that the illustrated region 301 depicts a portion of the n-masking layer 94 that is representative of any or all other portions of the n-masking layer 94 disposed over the structures. For example, an upper portion of the n-masking layer 94 may comprise a crystalline layer 94C, while a lower portion of the n-masking layer 94 may remain a substantially amorphous layer 94A. The crystalline layer 94C may have a thickness $T_{94C}$ of between about 2 nm and about 5 nm, and the amorphous layer 94A may have a thickness $T_{94A}$ of between about 2 nm and about 5 nm. The n-masking layer 93 may become thinner as some or all of the p-masking layer 93 crystallizes and/or densifies during the post-deposition treatment 300.

Figure 18A:
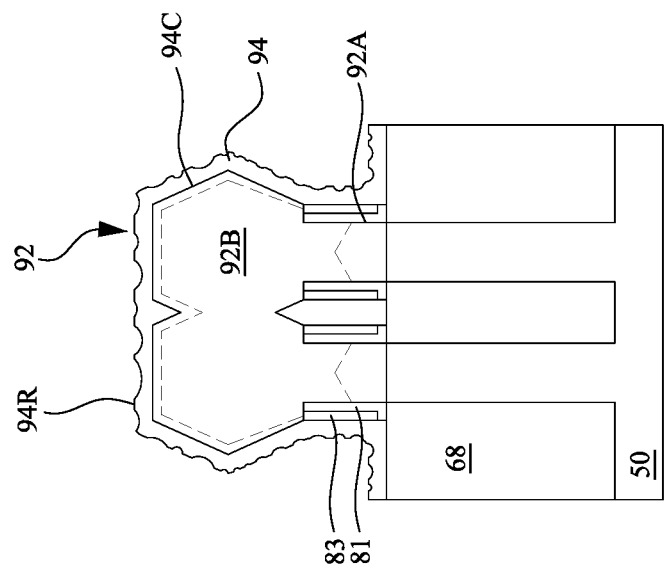
Figure 18B:
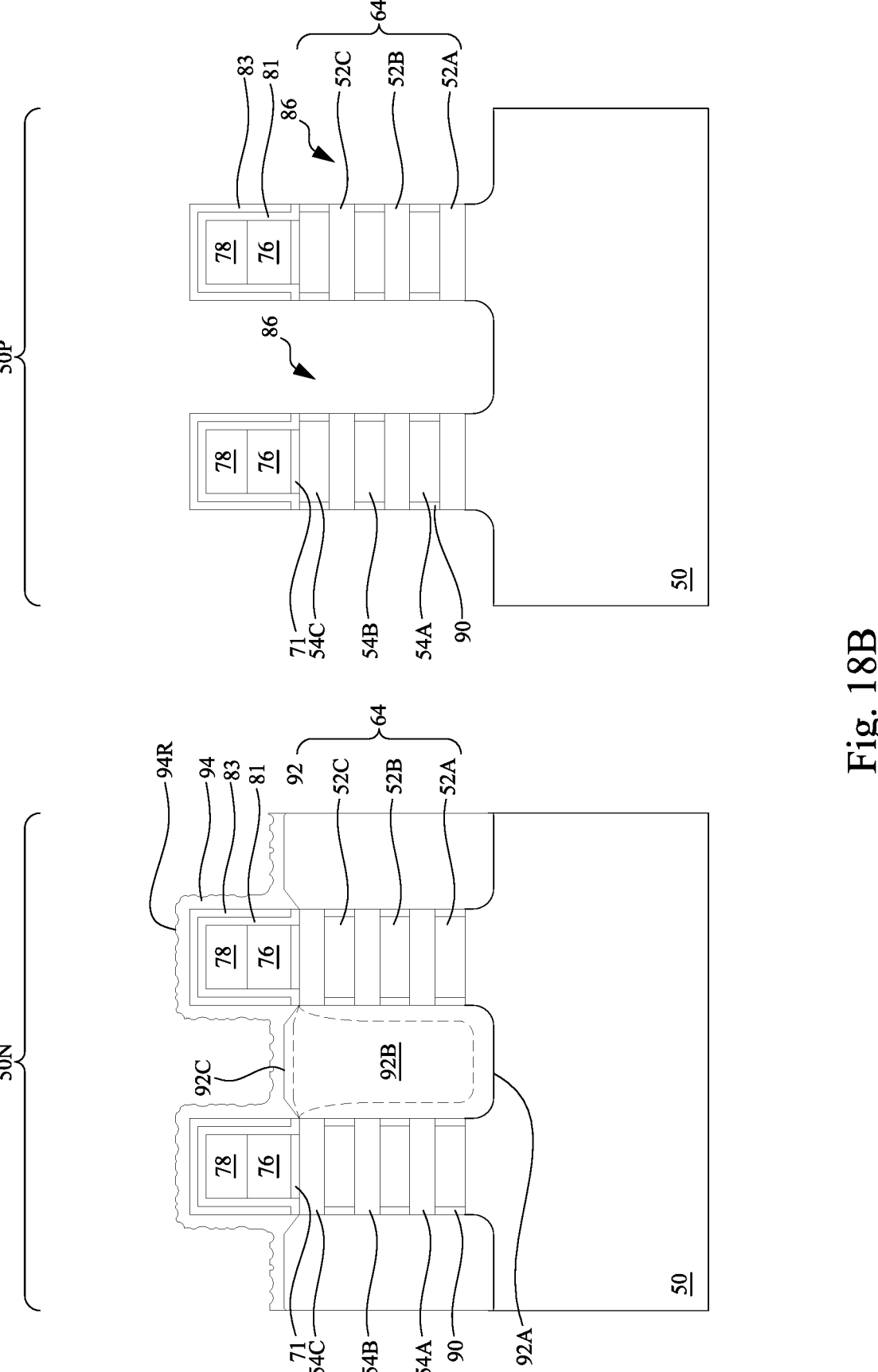
Figure 18C:
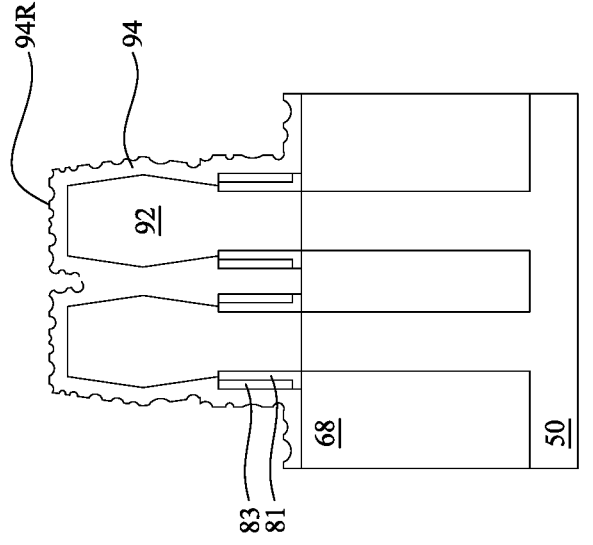

Referring to FIGS. 18A-18C, after the post-deposition treatment 300, the n-masking layer 94 is removed from the p-type region 50P. A photoresist (not specifically illustrated), such as a hardmask, may be formed over the n-masking layer 94 and patterned to expose the n-masking layer 94 in the p-type region 50P. The n-masking layer 94 may be etched using a suitable etching process, such as an isotropic etching process (e.g., a wet etching process), an anisotropic etching process (e.g., a dry etching process), or the like. The photoresist may then be removed by a suitable process, such as an isotropic etching process or an anisotropic etching process. In other embodiments, the n-masking layer 94 is removed in the p-type region 50P by one of the above processes without first forming the photoresist over the n-masking layer 94.

Figure 19A:
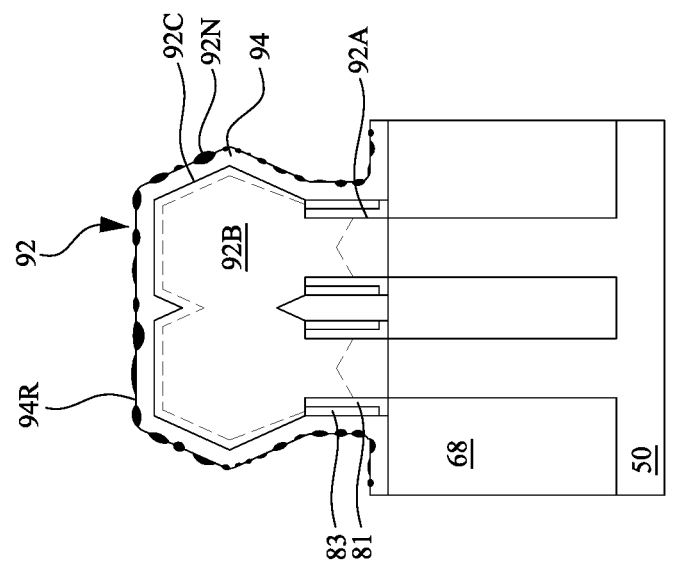
Figure 19B:
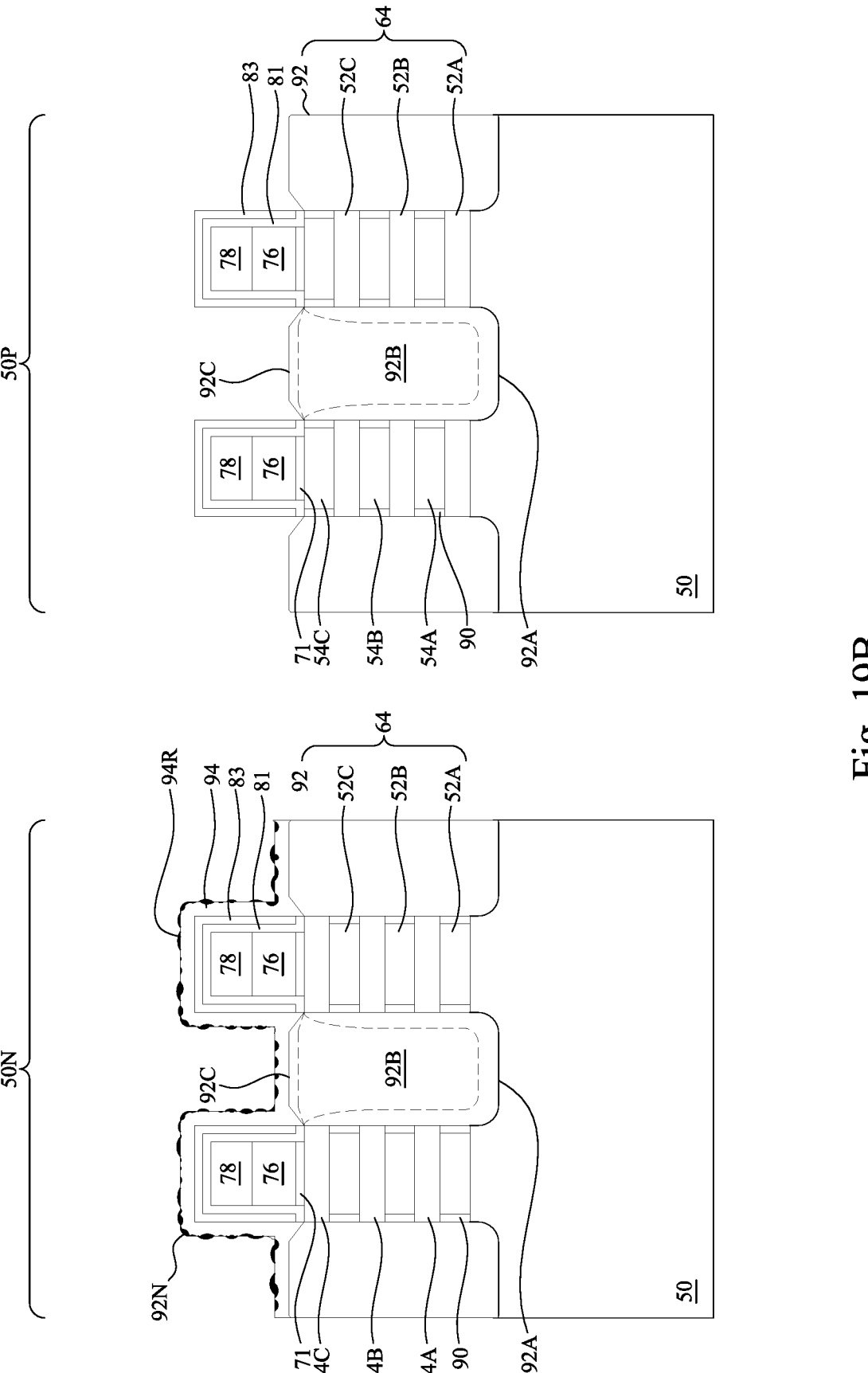
Figure 19C:
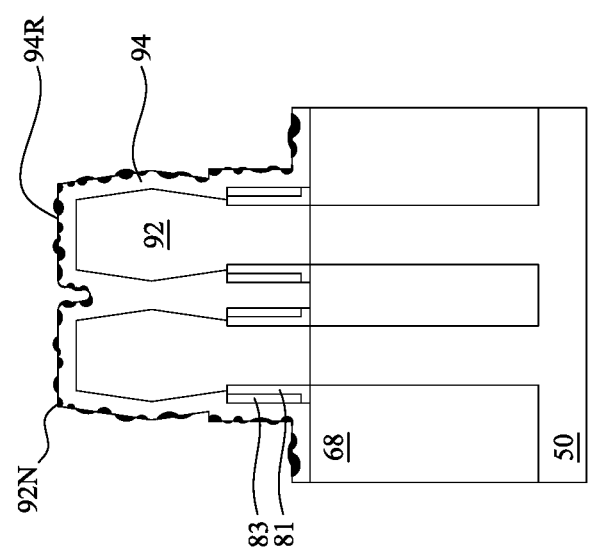

Referring to FIGS. 19A-19C, the epitaxial source/drain regions 92 are epitaxially grown in the first recesses 86 in the p-type region 50P, and nodules 92N of epitaxial material may form over the n-masking layer 94. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, germanium, germanium tin, or the like. The epitaxial source/drain regions 92 may also have surfaces raised from respective surfaces of the multi-layer stack 64 and may have facets.

As stated above, nodules 92N (e.g., small amounts of the epitaxy) may grow over the n-masking layer 94. However, the rough surface 94B of the n-masking layer 94 reduces the number and size of the nodules 92N that may otherwise form, which allows for greater control of the formation of the epitaxial source/drain regions 92 and improves removal of the n-masking layer 94 (and nodules 92N) in subsequent steps discussed in greater detail below. As illustrated, each of the epitaxial source/drain regions 92 forms to become one continuous material, while the nodules 92N form as discontinuous clusters or nodules.

The epitaxial source/drain regions 92, the first nanostructures 52, the second nanostructures 54, and/or the substrate 50 may be implanted with dopants to form source/drain regions, similarly to the processes previously discussed for forming lightly-doped source/drain regions, followed by an anneal. The source/drain regions may have an impurity concentration of between about 1×10⁹ atoms/cm³ and about 1×10²¹ atoms/cm³. The p-type impurities for source/drain regions may be any of the impurities previously discussed. The p-type impurities may be implanted while the n-masking layer 94 remains protecting the n-type region 50N. In some embodiments, the epitaxial source/drain regions 92 may be in situ doped during growth.

As discussed above with respect to the epitaxial source/drain regions 92 in the n-type region 50N, the epitaxial source/drain regions 92 in the p-type region 50P may comprise similar or different shapes for reasons similar to those stated above with respect to the epitaxial source/drain regions 92 in the n-type region 50N. For example, as a result of the epitaxy processes used to form the epitaxial source/drain regions 92 in the p-type region 50P, the upper surfaces of the epitaxial source/drain regions 92 have facets which expand laterally outward beyond sidewalls of the nanostructures 55. In some embodiments, these facets cause adjacent epitaxial source/drain regions 92 of a same NSFET to merge similarly as illustrated above by FIG. 15A. In other embodiments, adjacent epitaxial source/drain regions 92 remain separated after the epitaxy process is completed similarly as illustrated above by FIG. 15C. In the embodiments similar to those illustrated in FIGS. 15A and 15C, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

As discussed above with respect to the epitaxial source/drain regions 92 in the n-type region 50N in connection with FIGS. 15A-15C, the epitaxial source/drain regions 92 in the p-type region 50P may comprise one or more semiconductor material layers with one or more different dopant concentrations similarly or differently as discussed above.

Referring to FIGS. 20A-20D, the n-masking layer 94 and the nodules 92N may be removed from the n-type region 50N. For example, the n-masking layer 94 and the nodules 92N may be removed using a wet or dry etch with etchants such as sulfuric acid ($H_2SO_4$), hydrogen fluoride (HF), hydrogen chloride (HCl), ammonia ($NH_3+H_2O$), the like, any combinations thereof, or any suitable etchants. The reduced size and number of the nodules 92N (due to the rough surface 94R of the n-masking layer 94) improve the efficiency of removing the n-masking layer 94 and the nodules 92N by the above-described process.

Figure 20A:
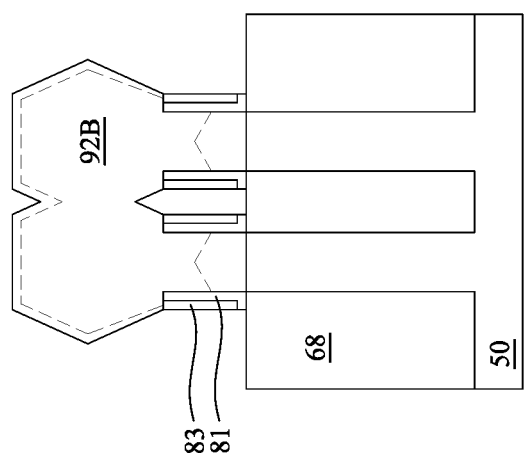
Figure 20B:
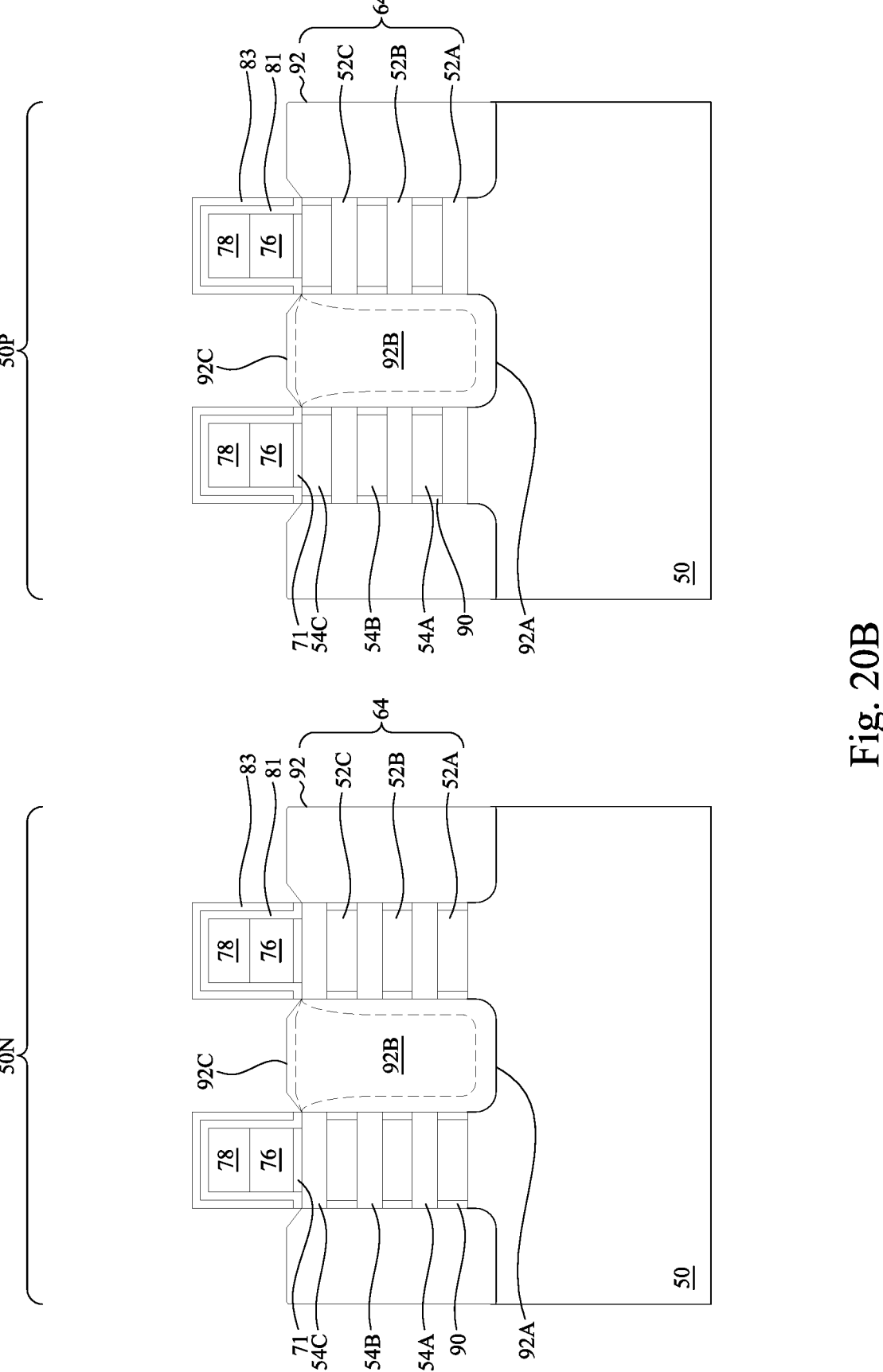
Figure 20C:
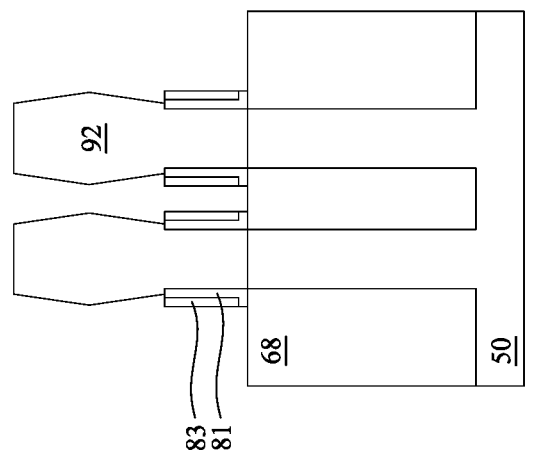
Figure 20D:
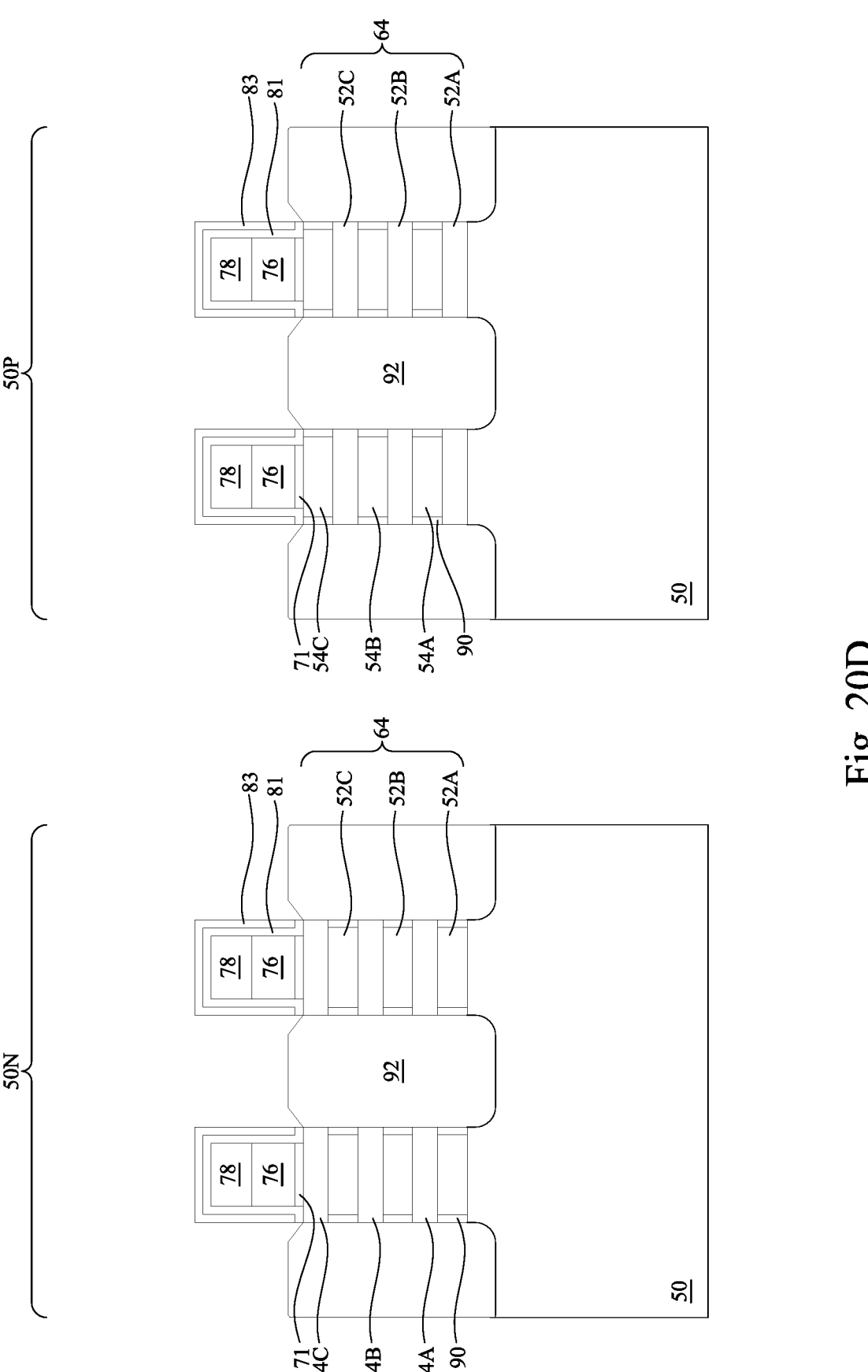

Referring to FIG. 20D, although the outer sidewalls of the first inner spacers 90 are illustrated as being straight in FIGS. 10B through 20B, the outer sidewalls of the first inner spacers 90 may be concave or convex. As an example, FIG. 20D illustrates an embodiment in which sidewalls of the first nanostructures 52 are concave, outer sidewalls of the first inner spacers 90 are concave, and the first inner spacers are recessed from sidewalls of the second nanostructures 54 in the n-type region 50N. As illustrated in connection with the n-type region 50N, the epitaxial source/drain regions 92 may be formed in contact with the first inner spacers 90 and may extend past sidewalls of the second nanostructures 54. Also illustrated are embodiments in which sidewalls of the second nanostructures 54 are concave, outer sidewalls of the first inner spacers 90 are concave, and the first inner spacers are recessed from sidewalls of the first nanostructures 52 in the p-type region 50P. As illustrated in connection with the p-type region 50P, the epitaxial source/drain regions 92 may be formed in contact with the first inner spacers 90 and may extend past sidewalls of the second nanostructures 54.

Figure 21A:
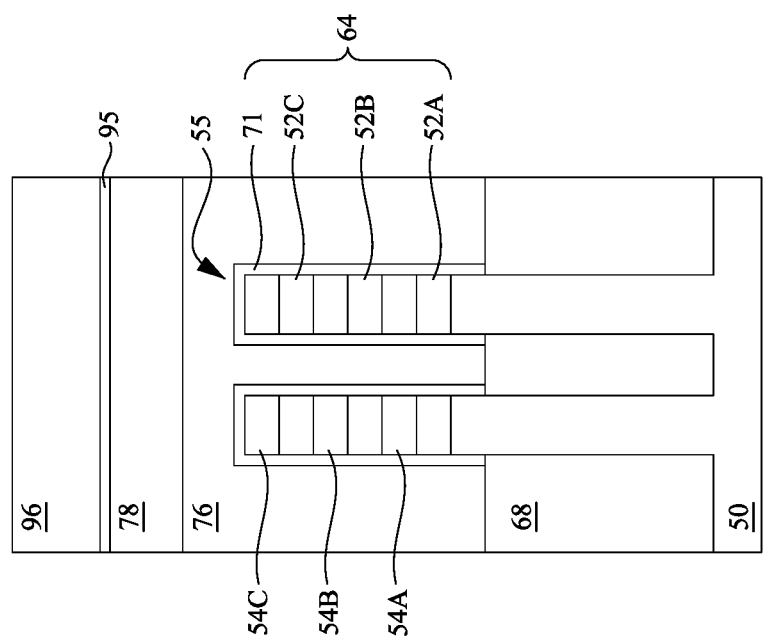
Figure 21B:
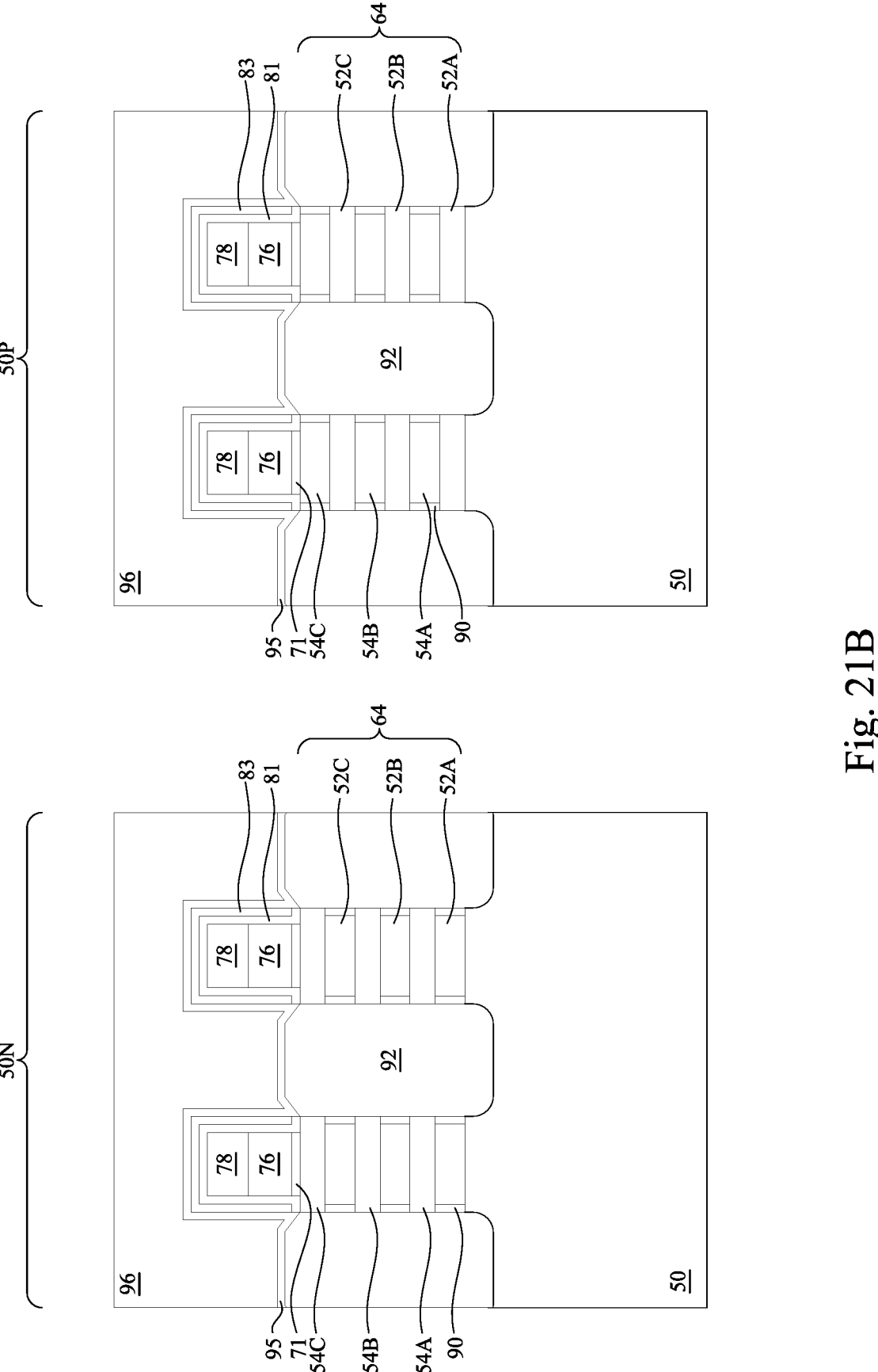
Figure 21C:
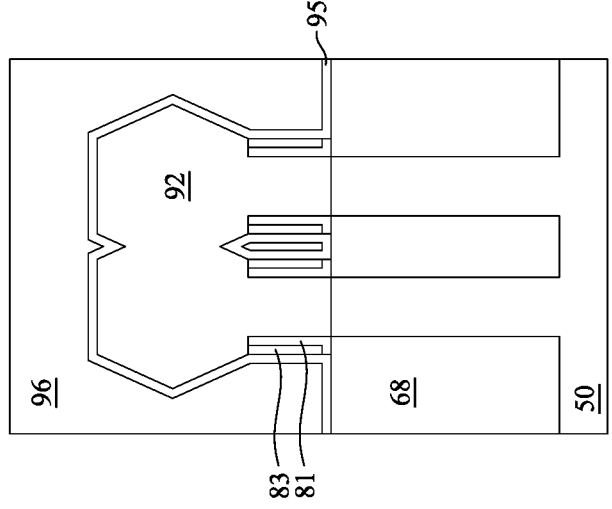

In FIGS. 21A-21C, a first interlayer dielectric (ILD) 96 is deposited over the structure illustrated in FIGS. 6A and 20A-20D (the processes of FIGS. 7A-20D do not alter the cross-section illustrated in FIG. 6A). The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 95 is disposed between the first ILD 96 and the epitaxial source/drain regions 92, the masks 78, and the first spacers 81. The CESL 95 may comprise a dielectric material, such as, silicon nitride, silicon oxide, silicon oxynitride, or the like, having a different etch rate than the material of the overlying first ILD 96.

Figure 22A:
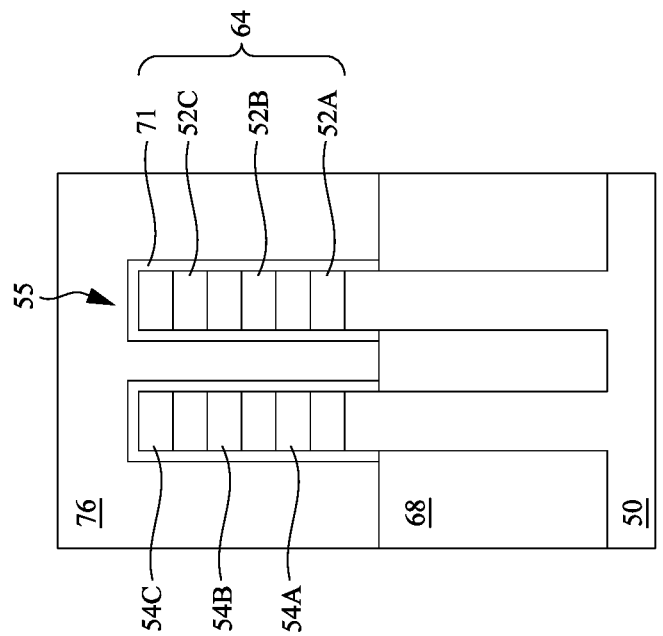
Figure 22B:
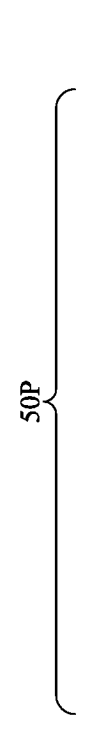
Figure 22B:
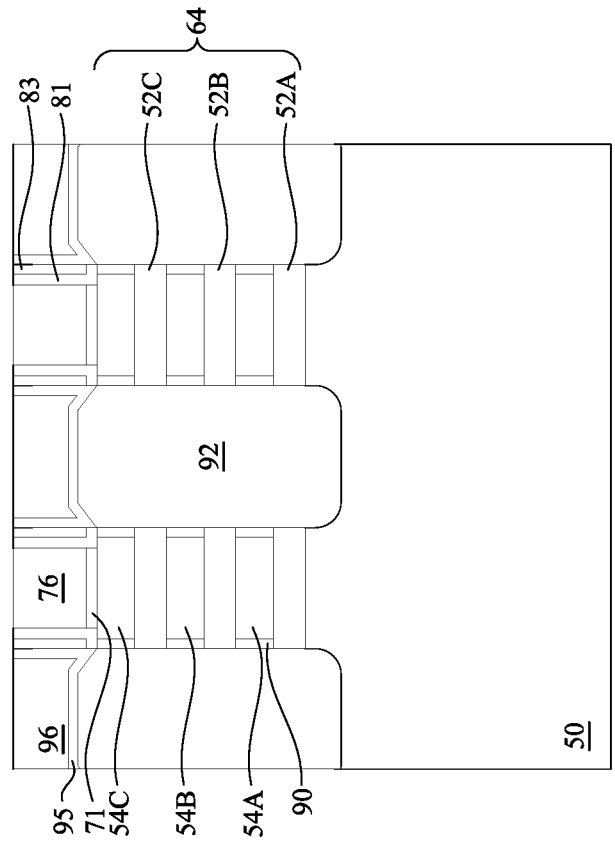
Figure 22B:
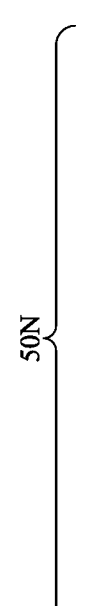
Figure 22B:
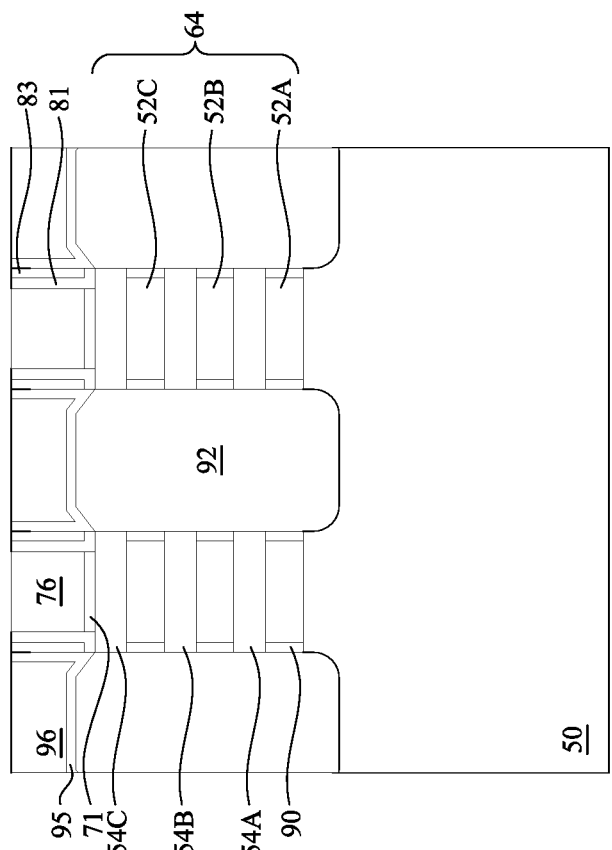

In FIGS. 22A-22B, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 23A:
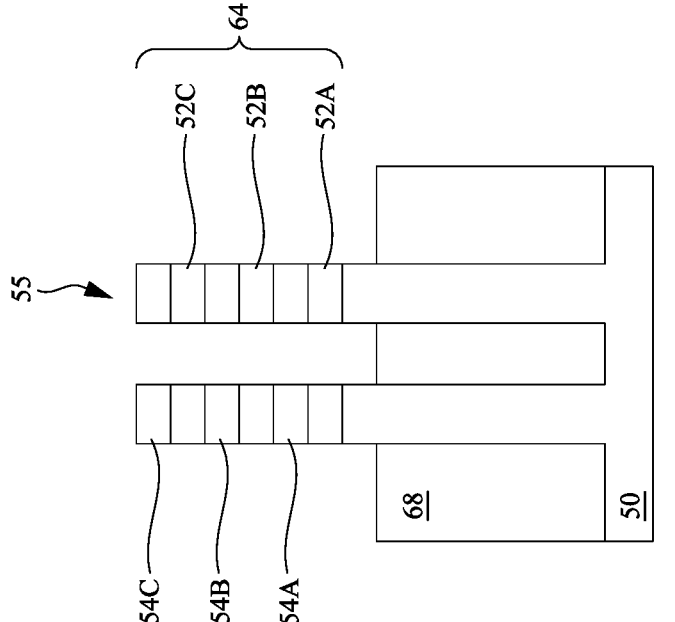
Figure 23B:
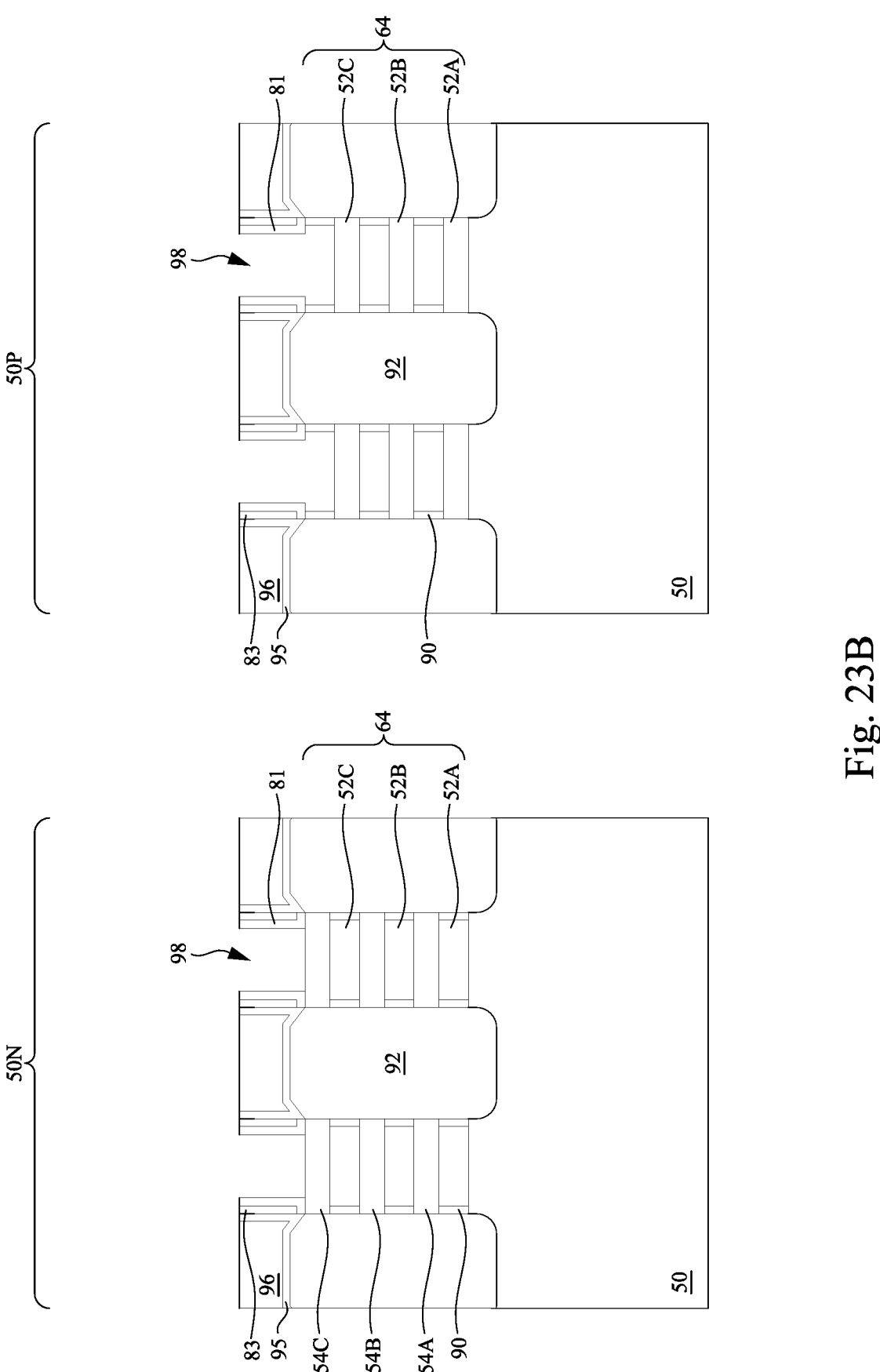

In FIGS. 23A and 23B, the dummy gates 76, and the masks 78 if present, are removed in one or more etching steps, so that second recesses 98 are formed. Portions of the dummy dielectric layers 60 in the second recesses 98 are also be removed. In some embodiments, the dummy gates 76 and the dummy dielectric layers 60 are removed by an anisotropic dry etch process. For example, the etching process may include a dry etch process using reaction gas(es) that selectively etch the dummy gates 76 at a faster rate than the first ILD 96 or the first spacers 81. Each second recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy dielectric layers 60 may be used as etch stop layers when the dummy gates 76 are etched. The dummy dielectric layers 60 may then be removed after the removal of the dummy gates 76.

Figure 24A:
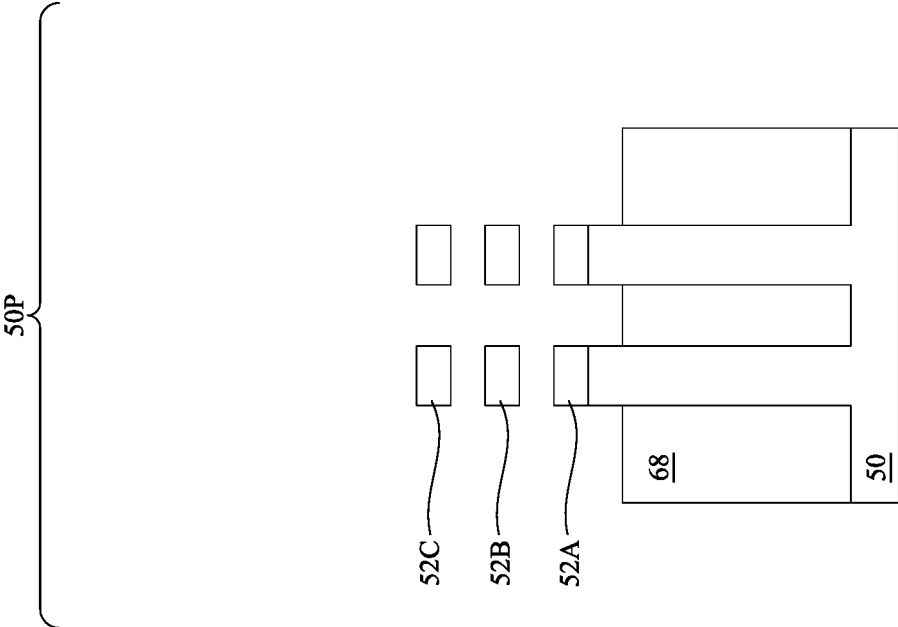
Figure 24A:
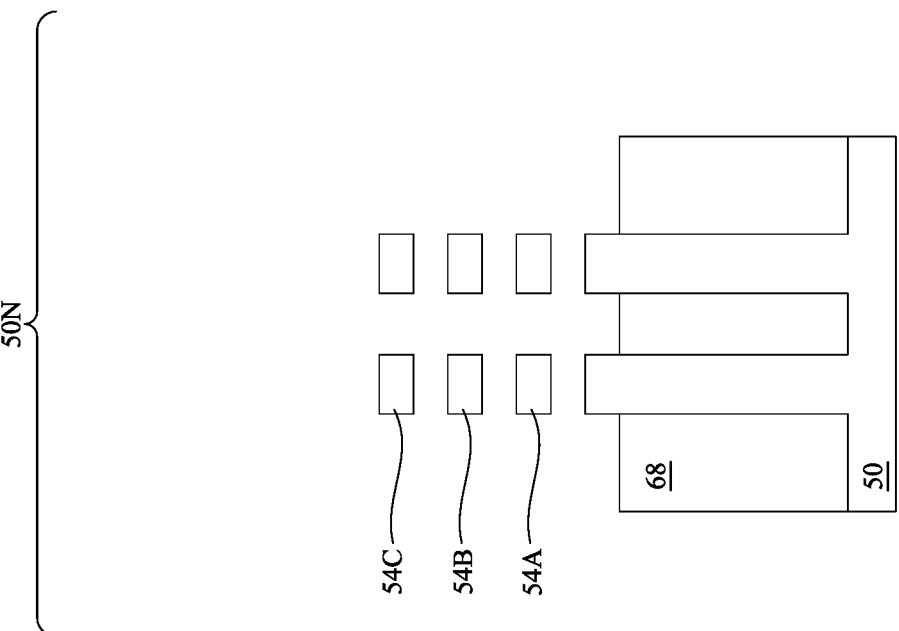
Figure 24B:
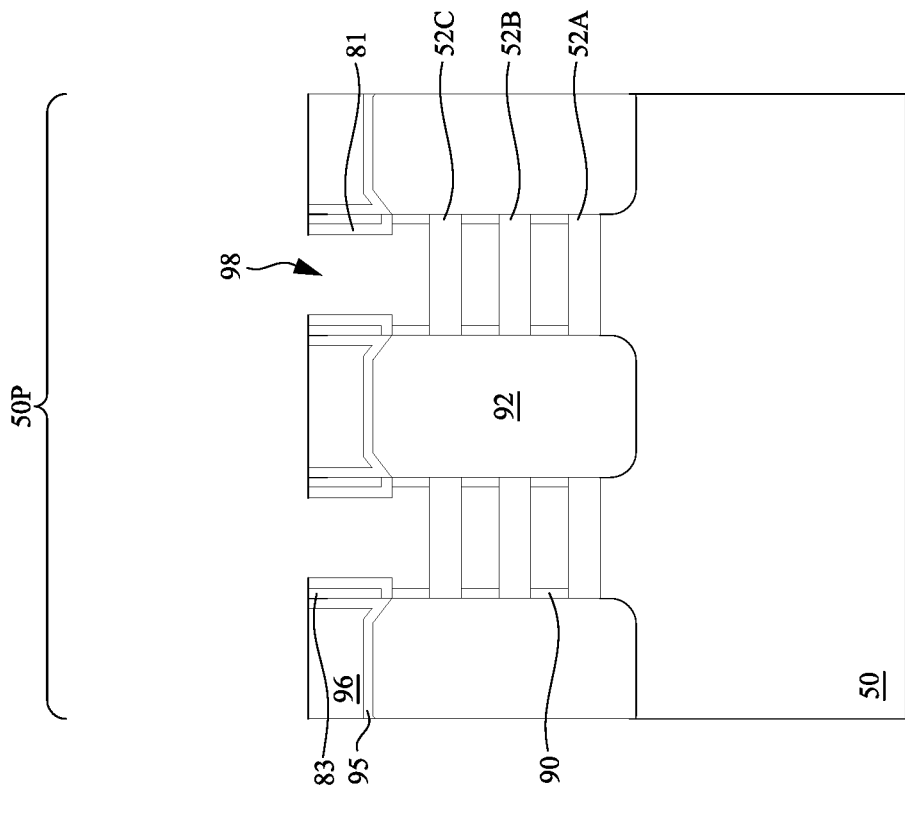
Figure 24B:
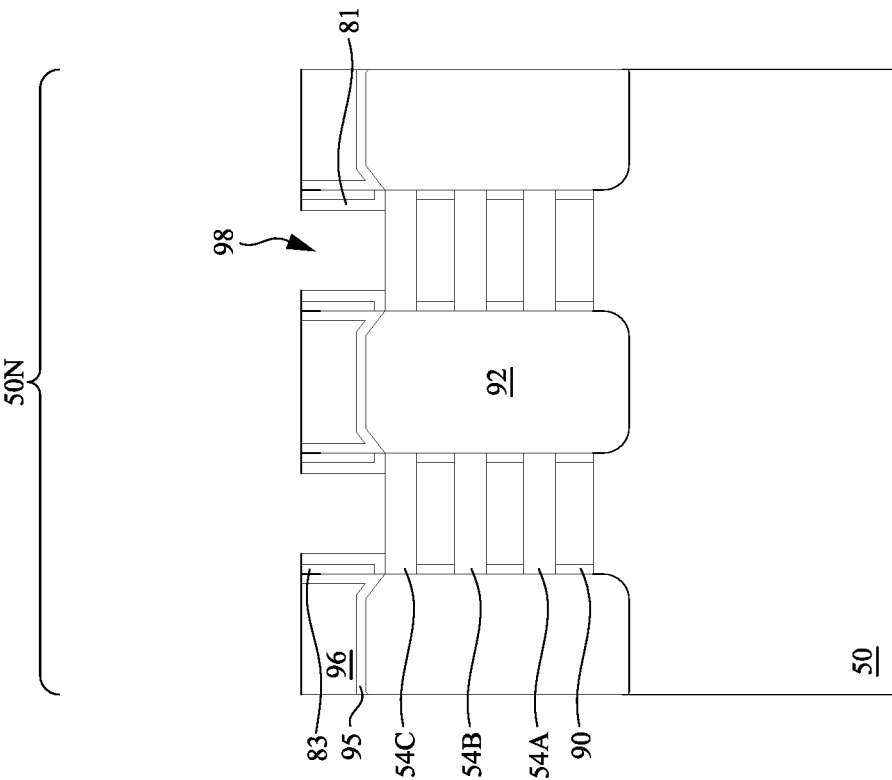

In FIGS. 24A and 24B, the first nanostructures 52 in the n-type region 50N and the second nanostructures 54 in the p-type region 50P are removed extending the second recesses 98. The first nanostructures 52 may be removed by forming a mask (not shown) over the p-type region 50P and performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide ($NH_4OH$), or the like may be used to remove the first nanostructures 52 in the n-type region 50N.

The second nanostructures 54 in the p-type region 50P may be removed by forming a mask (not shown) over the n-type region 50N and performing an isotropic etching process such as wet etching or the like using etchants which are selective to the materials of the second nanostructures 54, while the first nanostructures 52, the substrate 50, the STI regions 68 remain relatively unetched as compared to the second nanostructures 54. In embodiments in which the second nanostructures 54 include, e.g., SiGe, and the first nanostructures 52 include, e.g., Si or SiC, hydrogen fluoride, another fluorine-based etchant, or the like may be used to remove the second nanostructures 54 in the p-type region 50P.

Figure 25A:
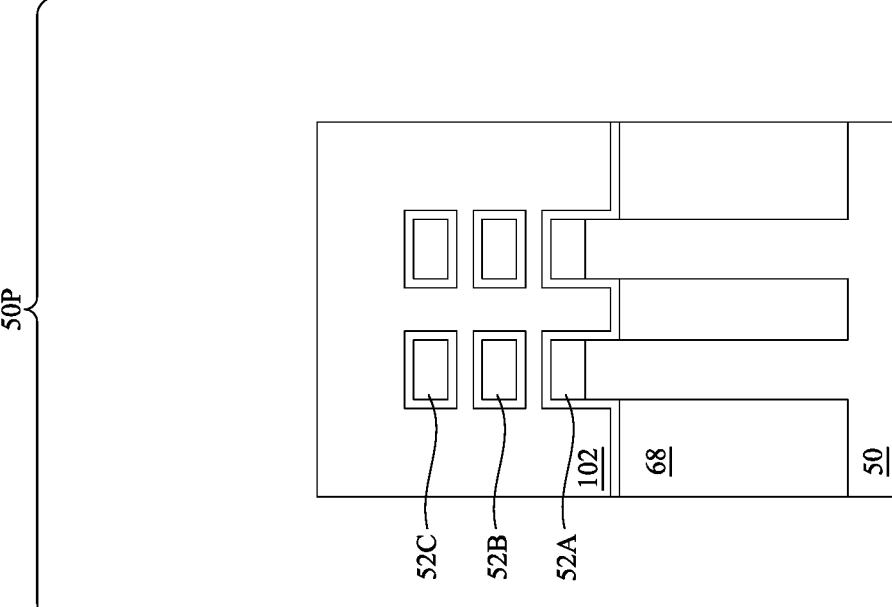
Figure 25A:
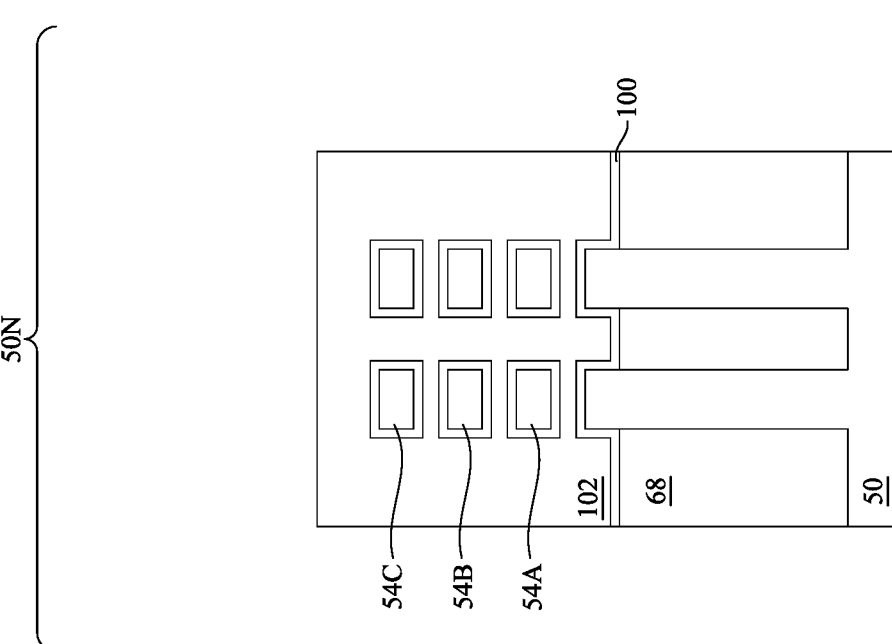
Figure 25B:
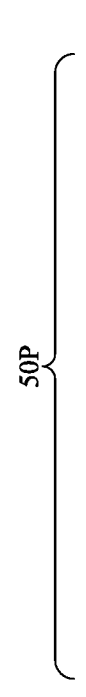
Figure 25B:
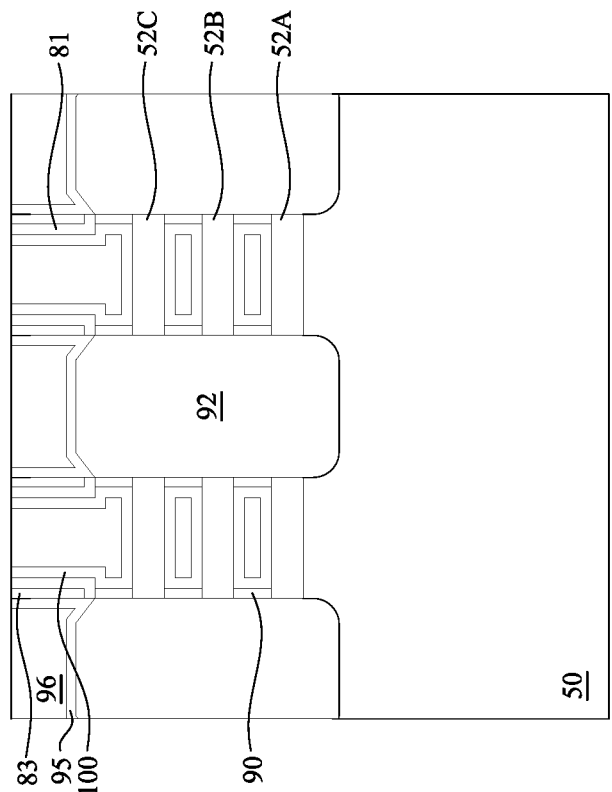
Figure 25B:
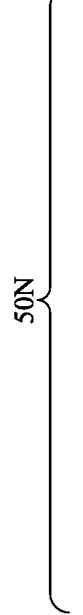
Figure 25B:
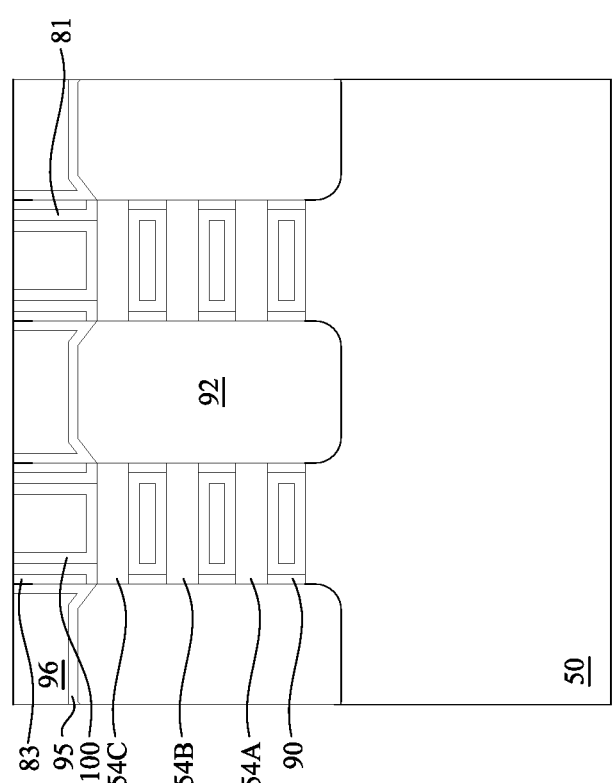

In FIGS. 25A and 25B, gate dielectric layers 100 and gate electrodes 102 are formed for replacement gates. The gate dielectric layers 100 are deposited conformally in the second recesses 98. In the n-type region 50N, the gate dielectric layers 100 may be formed on top surfaces and sidewalls of the substrate 50 and on top surfaces, sidewalls, and bottom surfaces of the second nanostructures 54, and in the p-type region 50P, the gate dielectric layers 100 may be formed on top surfaces and sidewalls of the substrate 50 and on top surfaces, sidewalls, and bottom surfaces of the first nanostructures 52. The gate dielectric layers 100 may also be deposited on top surfaces of the first ILD 96, the CESL 95, the first spacers 81, and the STI regions 68.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 25A and 25B, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructure 54A and the substrate 50, and may be deposited in the p-type region 50P between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 26A:
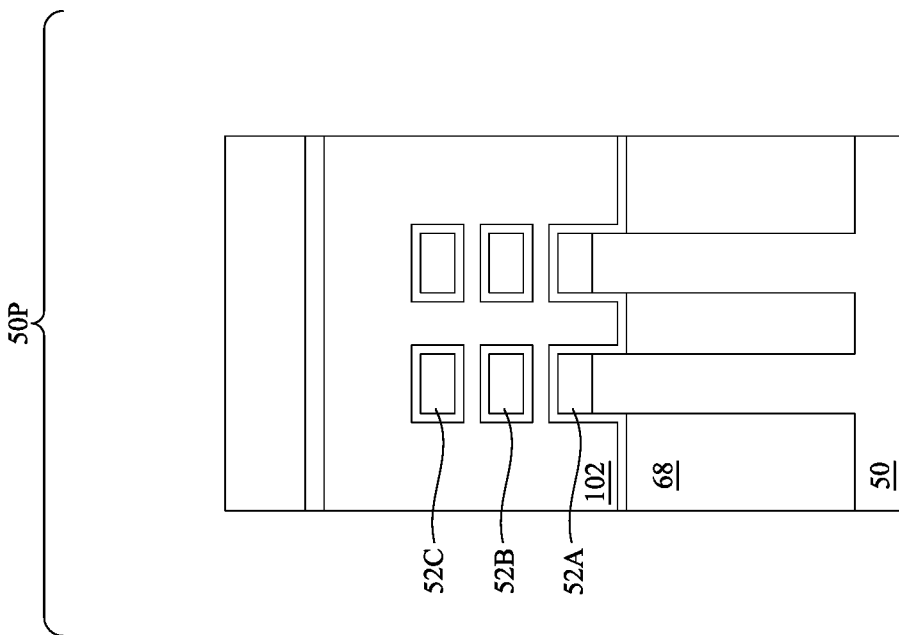
Figure 26A:
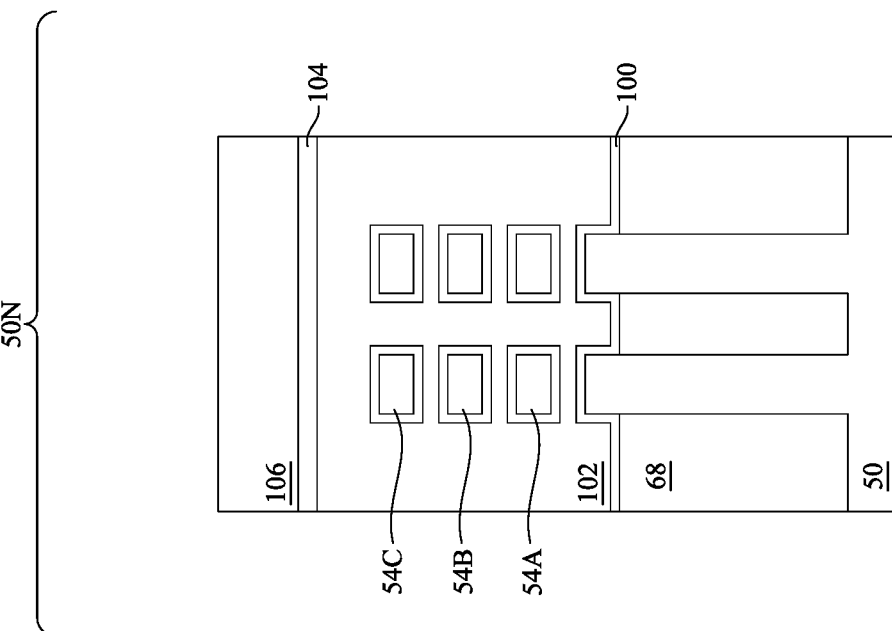
Figure 26B:
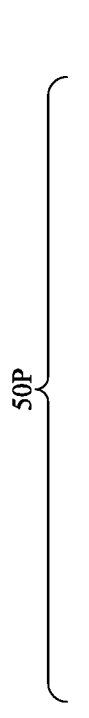
Figure 26B:
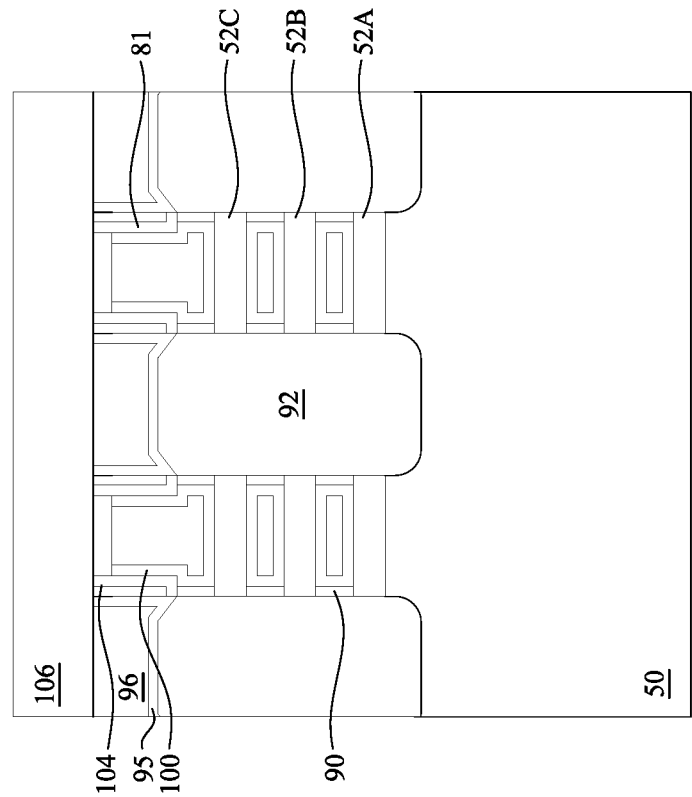
Figure 26B:
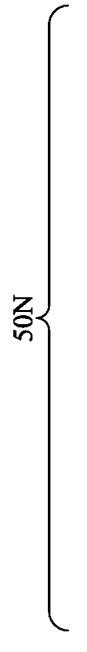
Figure 26B:
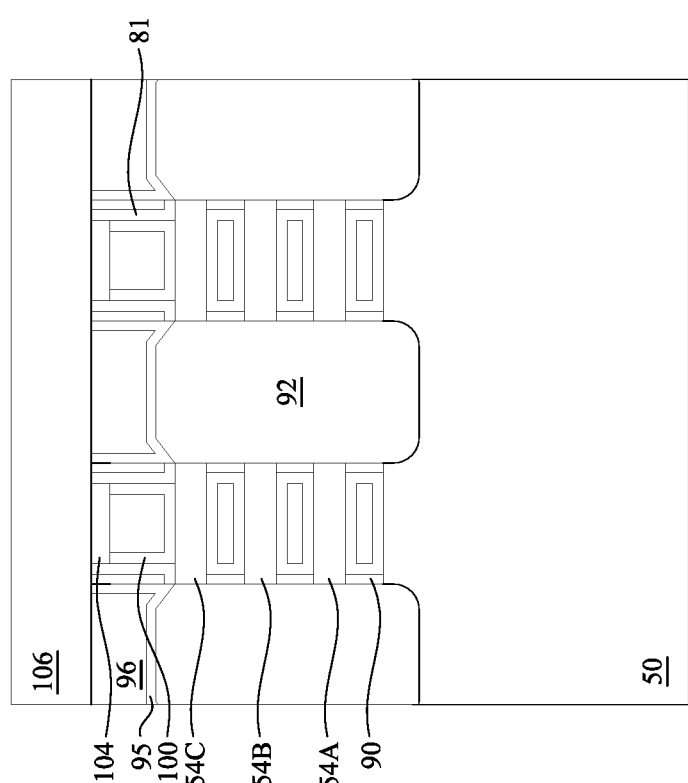
Figure 26C:
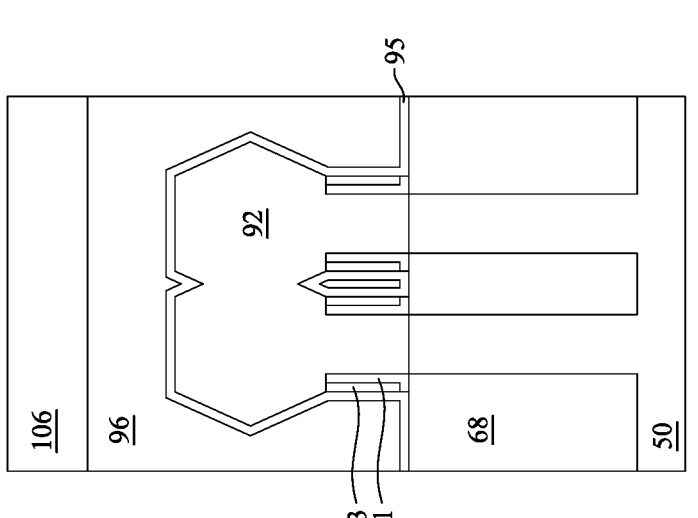

In FIGS. 26A-26C, the gate structure (including the gate dielectric layers 100 and the corresponding overlying gate electrodes 102) is recessed, so that a recess is formed directly over the gate structure and between opposing portions of first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIGS. 27A-28C) penetrate through the gate mask 104 to contact the top surface of the recessed gate electrodes 102.

As further illustrated by FIGS. 26A-26C, a second ILD 106 is deposited over the first ILD 96 and over the gate mask 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 27A:
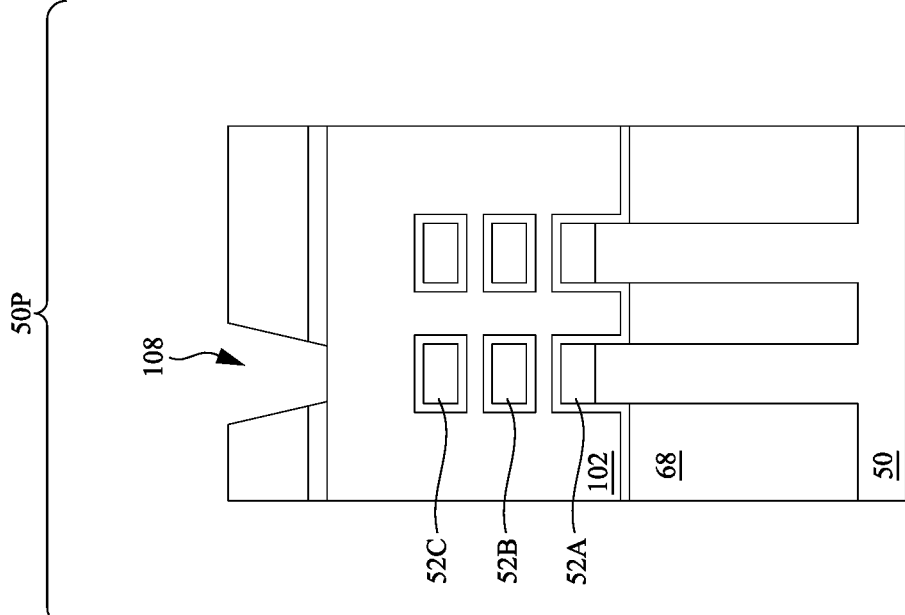
Figure 27A:
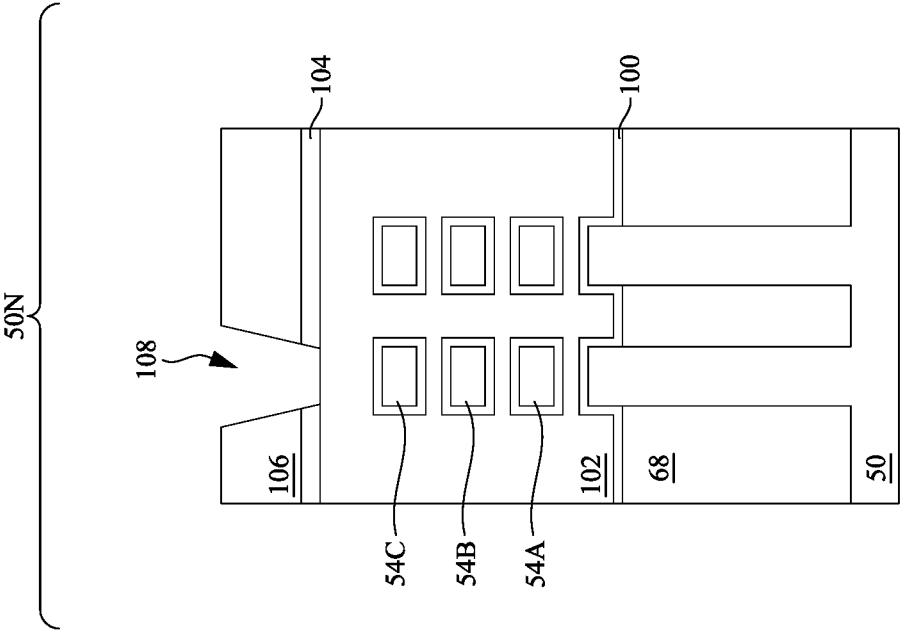
Figure 27B:
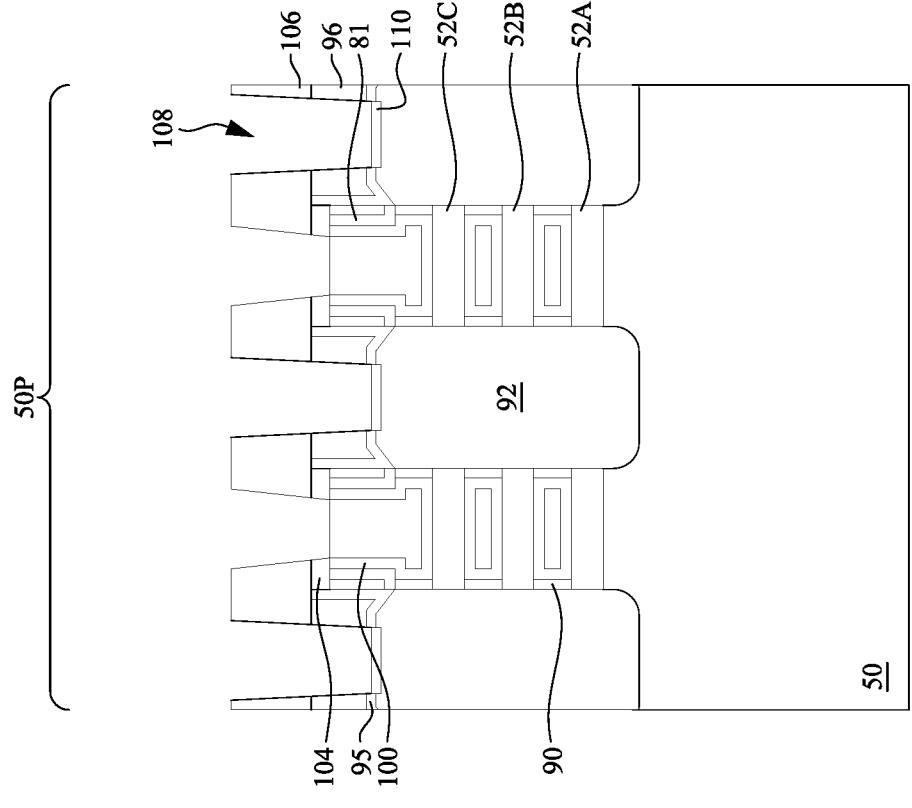
Figure 27B:
Figure 27B:
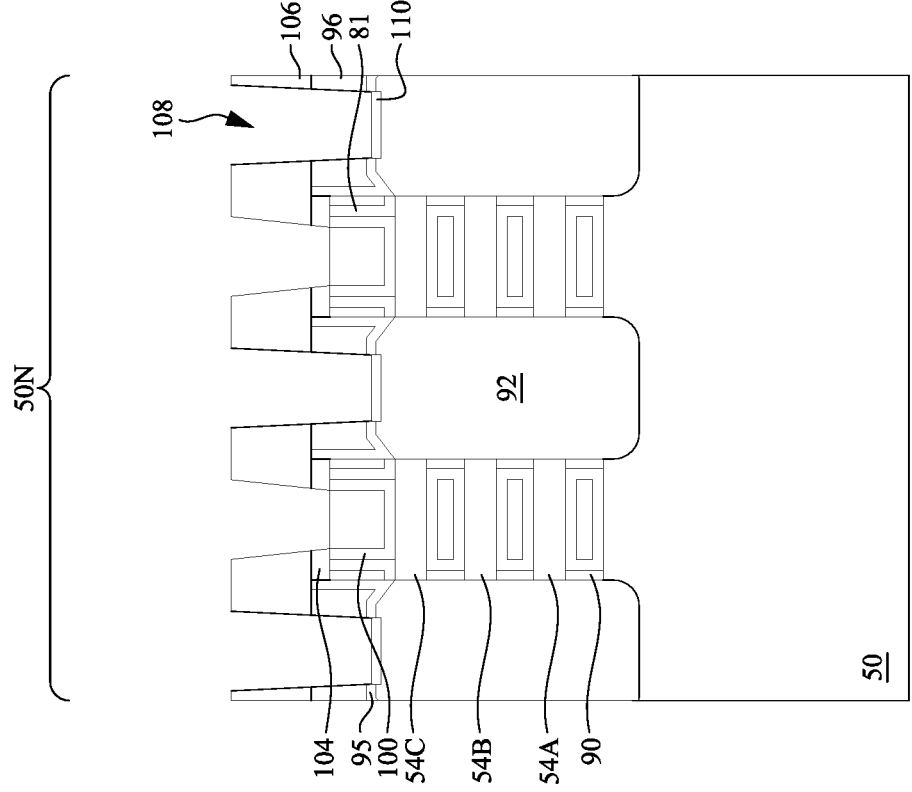
Figure 27C:
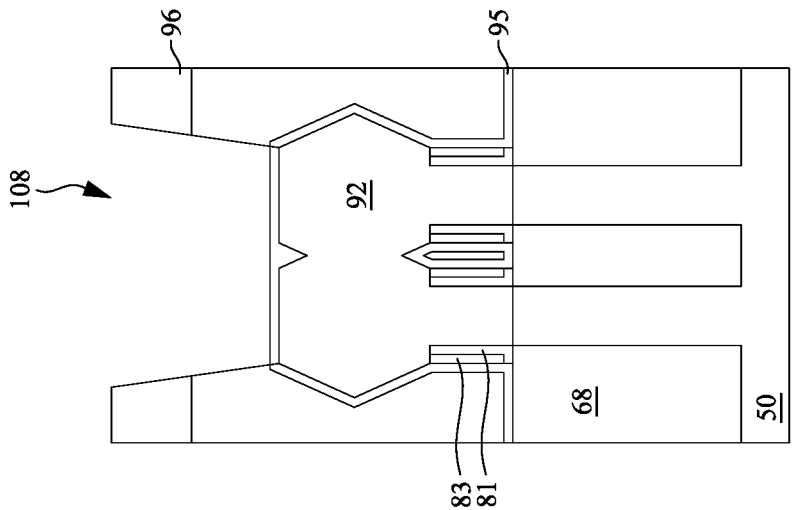

In FIGS. 27A-27C, the second ILD 106, the first ILD 96, the CESL 95, and the gate masks 104 are etched to form third recesses 108 exposing surfaces of the epitaxial source/drain regions 92 and/or the gate structure. The third recesses 108 may be formed by etching using an anisotropic etching process, such as RIE, NBE, or the like. In some embodiments, the third recesses 108 may be etched through the second ILD 106 and the first ILD 96 using a first etching process; may be etched through the gate masks 104 using a second etching process; and may then be etched through the CESL 95 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the epitaxial source/drain regions 92 and/or the gate structure, and a bottom of the third recesses 108 may be level with (e.g., at a same level, or having a same distance from the substrate), or lower than (e.g., closer to the substrate) the epitaxial source/drain regions 92 and/or the gate structure. Although FIG. 27B illustrates the third recesses 108 as exposing the epitaxial source/drain regions 92 and the gate structure in a same cross section, in various embodiments, the epitaxial source/drain regions 92 and the gate structure may be exposed in different cross-sections, thereby reducing the risk of shorting subsequently formed contacts. After the third recesses 108 are formed, silicide regions 110 are formed over the epitaxial source/drain regions 92. In some embodiments, the silicide regions 110 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 110. The un-reacted portions of the deposited metal are then removed, e.g., by an etching process. Although silicide regions 110 are referred to as silicide regions, silicide regions 110 may also be germanide regions, or silicon germanide regions (e.g., regions comprising silicide and germanide). In an embodiment, the silicide region 110 comprises TiSi, and has a thickness in a range between about 2 nm and about 10 nm.

Figure 28A:
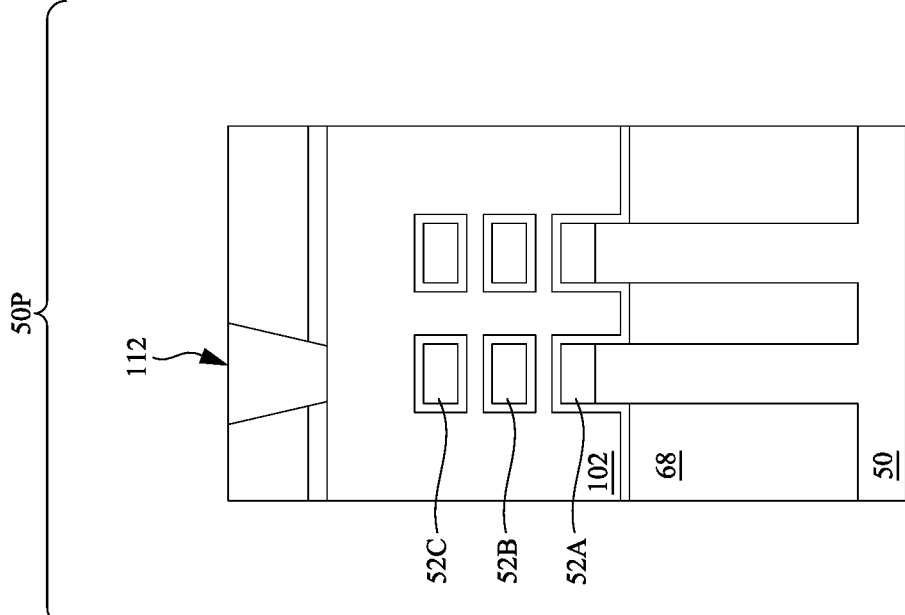
Figure 28A:
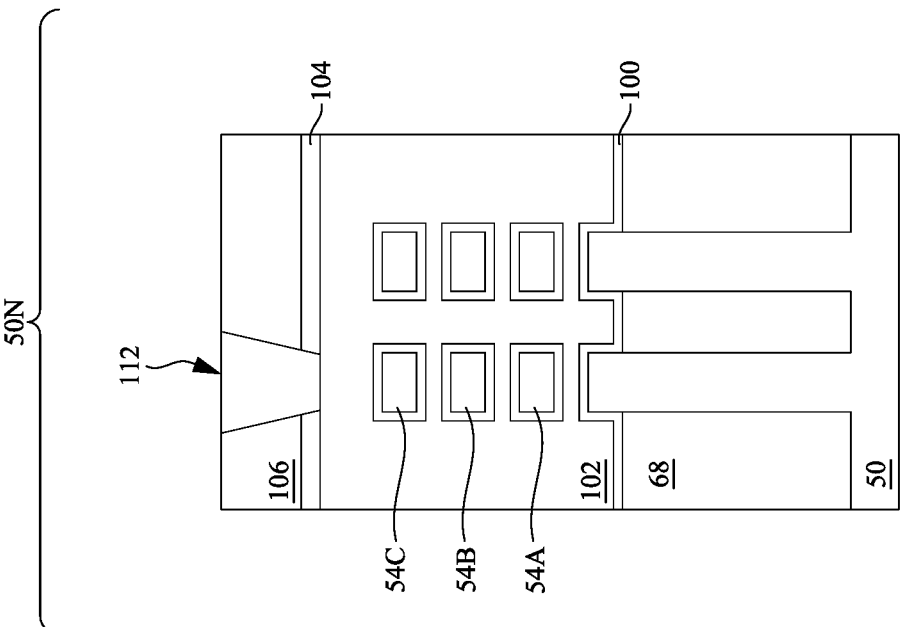
Figure 28B:
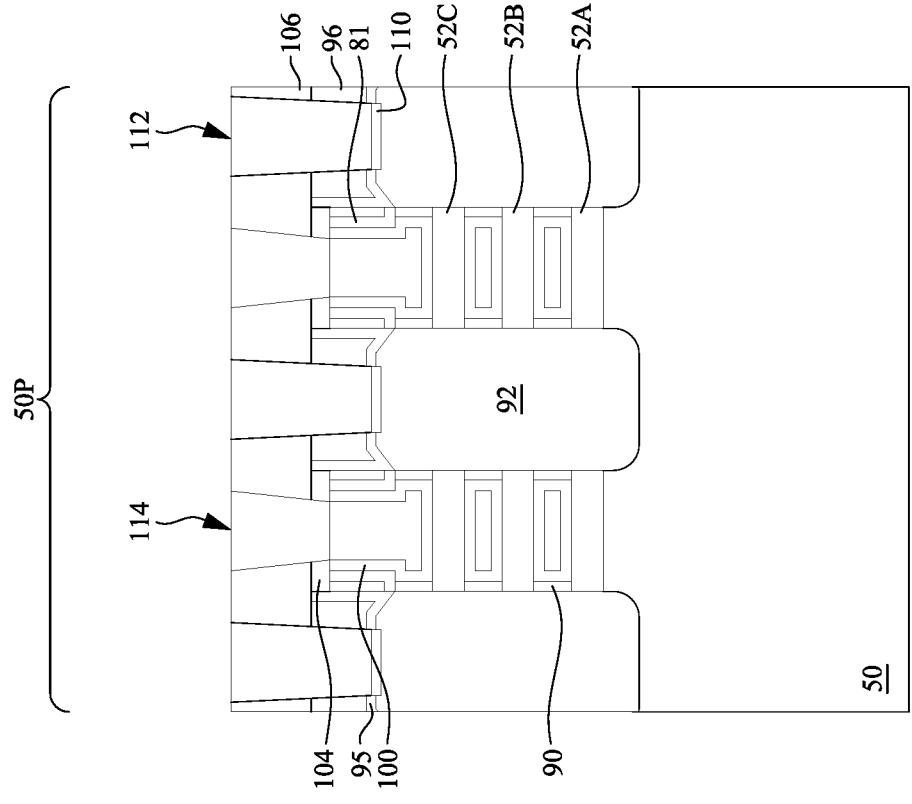
Figure 28B:
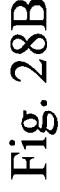
Figure 28B:
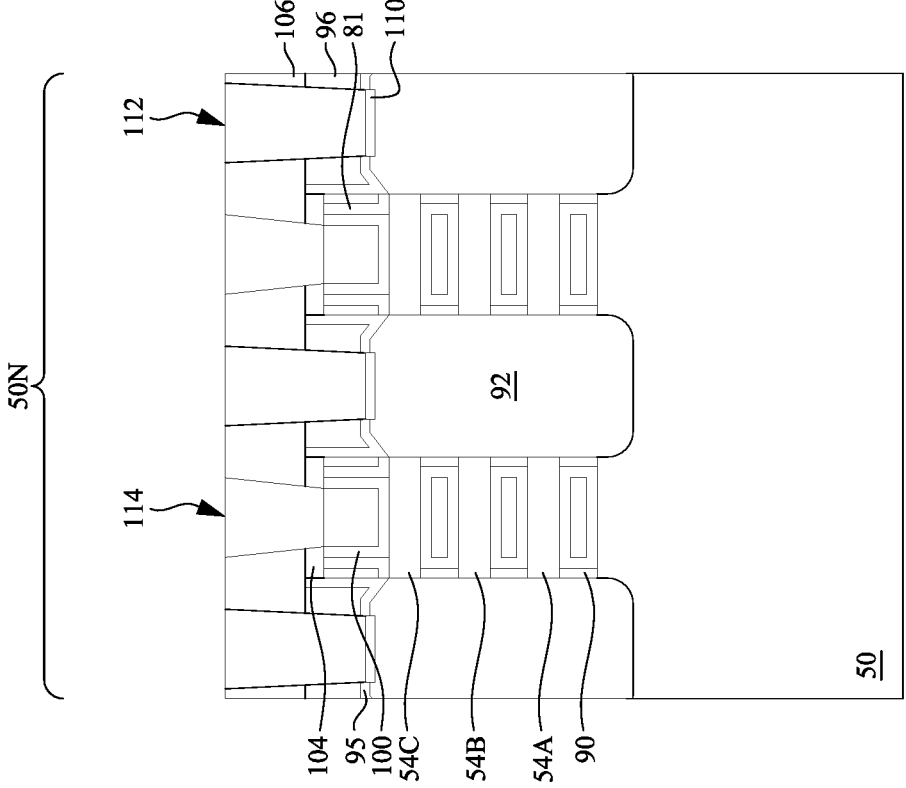
Figure 28C:
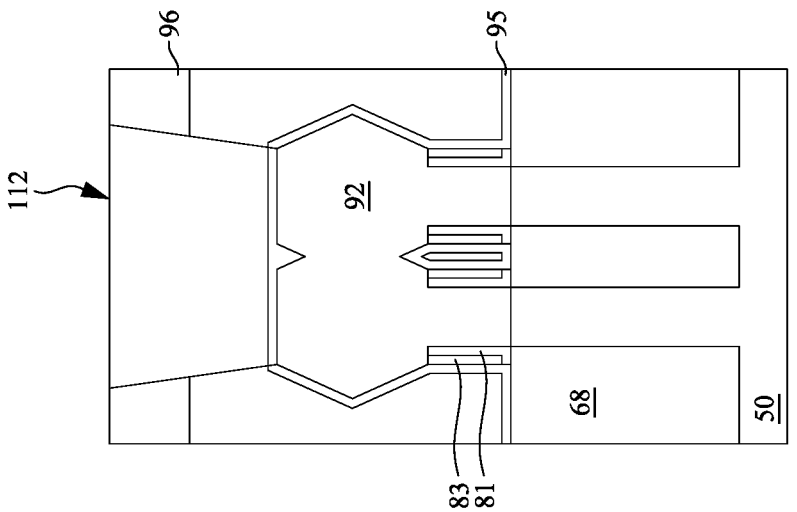

Next, in FIGS. 28A-28C, contacts 112 and 114 (may also be referred to as contact plugs) are formed in the third recesses 108. The contacts 112 and 114 may each comprise one or more layers, such as barrier layers, diffusion layers, and fill materials. For example, in some embodiments, the contacts 112 and 114 each include a barrier layer and a conductive material (not separately illustrated), and is electrically coupled to the underlying conductive feature (e.g., the gate electrode 102 and/or silicide region 110 in the illustrated embodiment). The contacts 114 are electrically coupled to the gate structure (e.g., the gate electrodes 102) and may be referred to as gate contacts, and the contacts 112 are electrically coupled to the silicide regions 110 and may be referred to as source/drain contacts. The barrier layer may include titanium, titanium nitride, tantalum, tantalum nitride, or the like. The conductive material 118 may be copper, a copper alloy, silver, gold, tungsten, cobalt, aluminum, nickel, or the like. A planarization process, such as a CMP, may be performed to remove excess material from a surface of the second ILD 106.

Although FIGS. 28A-28C illustrate a contact 112 extending to each of the epitaxial source/drain regions 92, the contact 112 may be omitted from certain ones of the epitaxial source/drain regions 92. For example, although not specifically illustrated, conductive features (e.g., power rails) may be subsequently attached through a backside of one or more of the epitaxial source/drain regions 92. For these particular epitaxial source/drain regions 92, the source/drain contacts 112 may be omitted or may be a dummy contact that is not electrically connected to any overlying conductive lines (also not specifically illustrated).

Embodiments may achieve advantages. For example, embodiments disclosed herein improve the yield and effectiveness in the formation of the epitaxial source/drain regions 92. In particular, forming a masking layer (e.g., p-masking layer 93 and n-masking layer 94) that comprises a metal oxide allows for a thinner masking layer that forms a complete protective layer over critical dimensions that are becoming smaller as technology progresses. In addition, performing a post-deposition treatment 200 or 300 on the masking layer achieves additional benefits. First, the post-deposition treatment 200 or 300 converts a smooth exposed surface (e.g., the smooth exposed surfaces 93S and 94S) of the masking layer into a rough exposed surface (e.g., the rough exposed surfaces 93R and 94R). The rougher exposed surfaces 93B/94B have lower selectivity for epitaxial growth during the formation of the epitaxial source/drain regions 92 than the smoother exposed surfaces 93A/94A. Second, the lower selectivity for epitaxial growth improves critical dimension control by minimizing the number and/or duration of epitaxial etching steps that may be performed in conjunction with the epitaxial growth. Third, the reduced epitaxial growth over the masking layer results in a masking layer that may be subsequently removed (e.g., by isotropic wet etching) without being hindered by large nodules of epitaxial material or large numbers of nodules of epitaxial material disposed over the masking layer.

In an embodiment, a method includes forming a semiconductor layer over a substrate; etching a portion of the semiconductor layer to form a first recess and a second recess; forming a first masking layer over the semiconductor layer; performing a first thermal treatment on the first masking layer, the first thermal treatment densifying the first masking layer; etching the first masking layer to expose the first recess; forming a first semiconductor material in the first recess; and removing the first masking layer. In another embodiment, the first semiconductor material includes at least one of silicon germanium, silicon carbide, phosphorous doped silicon carbide, and silicon phosphide. In another embodiment, the performing the first thermal treatment includes a radiation treatment. In another embodiment, the performing the first thermal treatment includes a plasma treatment. In another embodiment, the first thermal treatment crystallizes at least a portion of the first masking layer. In another embodiment, after the first thermal treatment, the first masking layer has a rougher upper surface than before the first thermal treatment. In another embodiment, the method includes forming a second masking layer over the semiconductor layer; performing a second thermal treatment on the second masking layer, the second thermal treatment densifying the second masking layer; etching the second masking layer to expose the second recess; and forming a second semiconductor material in the second recess. In another embodiment, one of the first thermal treatment and the second thermal treatment further includes a plasma treatment.

In an embodiment, a method includes forming a semiconductor layer over a first substrate; etching the semiconductor layer to form a first recess in a first region and a second recess in a second region; depositing a first masking layer over the first region and the second region; roughening the first masking layer; removing the first masking layer from the second region; forming a first epitaxial source/drain region in the second recess; removing a remainder of the first masking layer; depositing a second masking layer over the first region and the second region; roughening the second masking layer; removing the second masking layer from the first region; forming a second epitaxial source/drain region in the first recess; removing a remainder of the second masking layer; and forming a gate structure over the semiconductor layer. In another embodiment, the roughening the first masking layer includes performing a thermal treatment on the first masking layer. In another embodiment, the performing the thermal treatment on the first masking layer is performed at a temperature of greater than 650° C. In another embodiment, the first masking layer includes a metal oxide. In another embodiment, one of the roughening the first masking layer and the roughening the second masking layer includes a thermal treatment, and wherein the other includes a plasma treatment. In another embodiment, one of the roughening the first masking layer and the roughening the second masking layer further includes a UV radiation treatment. In another embodiment, before the roughening the first masking layer, the first masking layer is amorphous, and wherein after roughening the first masking layer, at least an upper portion of the first masking layer is crystalline. In another embodiment, the removing the remainder of the first masking layer includes a wet etch using hydrofluoric acid.

In an embodiment, a method includes depositing a masking layer over a substrate, the substrate includes a first recess and a second recess; performing a post-deposition treatment on the masking layer; anisotropically etching the masking layer to expose the second recess; epitaxially growing a first portion of a semiconductor material over the masking layer and a second portion of the semiconductor material in the second recess, the first portion includes discontinuous nodules; and isotropically etching to remove the masking layer. In another embodiment, the performing the post-deposition treatment includes performing a thermal treatment. In another embodiment, the performing the post-deposition treatment further includes performing a plasma treatment. In another embodiment, the post-deposition treatment further includes a UV treatment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a semiconductor layer over a first substrate;

etching the semiconductor layer to form a first recess in a first region and a second recess in a second region;

forming a first masking layer over the first region, forming the first masking layer comprising:
  depositing a metal oxide layer over the first region and the second region;
  performing a post-deposition treatment on the metal oxide layer, wherein performing the post-deposition treatment comprises increasing a roughness of the metal oxide layer; and
  removing the metal oxide layer from the second region;
forming a first epitaxial source/drain region in the second recess; and
removing a remainder of the first masking layer.
2. The method of claim 1, wherein performing the post-deposition treatment comprises increasing a deposition selectivity of an epitaxial material of the first epitaxial source/drain region.
3. The method of claim 1, wherein the post-deposition treatment comprises a thermal treatment.
4. The method of claim 1, wherein the post-deposition treatment comprises a plasma treatment.
5. The method of claim 1, wherein performing the post-deposition treatment comprises crystallizing a portion of the metal oxide layer.
6. The method of claim 1, wherein forming the first epitaxial source/drain region in the second recess further comprises forming discontinuous nodules over the metal oxide layer.
7. The method of claim 1, further comprising, after removing the remainder of the first masking layer, forming a second masking layer over the second region, forming the second masking layer comprising:
  depositing an additional metal oxide layer over the first region and the second region;
  performing an additional post-deposition treatment on the additional metal oxide layer; and
  removing the additional metal oxide layer from the first region.
8. The method of claim 7, further comprising:
forming a second epitaxial source/drain region in the first recess; and
removing a remainder of the second masking layer.
9. A method, comprising:
forming a first fin and a second fin over a substrate;
etching a first recess in the first fin and a second recess in the second fin;
depositing an oxide mask layer over the first fin and the second fin;
performing a treatment process on the oxide mask layer, the treatment process increasing a deposition selectivity of a semiconductor material on the first fin compared with the oxide mask layer, wherein increasing the deposition selectivity comprises making the semiconductor material less easily deposited over the oxide mask layer;
etching to remove a portion of the oxide mask layer from the first fin;
depositing a first silicon material in the first recess and a second silicon material over a remaining portion of the oxide mask layer, the first silicon material being a continuous material having a crystalline structure of the first fin, the second silicon material comprising discontinuous nodules; and
etching to remove the discontinuous nodules and the remaining portion of the oxide mask layer.
10. The method of claim 9, wherein the oxide mask layer comprises a metal oxide.

11. The method of claim 9, wherein performing the treatment process on the oxide mask layer comprises a UV radiation treatment.
12. The method of claim 11, wherein performing the treatment process on the oxide mask layer further comprises a thermal treatment.
13. The method of claim 12, wherein the thermal treatment comprises a temperature between 650° C. and 900° C.
14. The method of claim 9, wherein performing the treatment process comprises increasing a density of the oxide mask layer.
15. A method, comprising:
forming a first dummy gate stack over a semiconductor substrate in a first region, the first region having a first conductivity type;
forming a second dummy gate stack over the semiconductor substrate in a second region, the second region having a second conductivity type;
forming a first metal oxide layer over the first region and the second region;
performing a first treatment process on the first metal oxide layer;
after performing the first treatment process, removing a portion of the first metal oxide layer from the first region;
forming a first epitaxial source/drain region in the semiconductor substrate adjacent to the first dummy gate stack and first nodules of semiconductor material over a remainder of the first metal oxide layer;
performing a first etch process to remove the first metal oxide layer and the first nodules of semiconductor material;
after performing the first etch process, forming a second metal oxide layer over the first region and the second region;
forming a second epitaxial source/drain region in the semiconductor substrate adjacent to the second dummy gate stack and second nodules of semiconductor material over a remainder of the second metal oxide layer;
performing a second etch process to remove the second metal oxide layer and the second nodules of semiconductor material; and
replacing at least a portion of the first dummy gate stack with a gate electrode.
16. The method of claim 15, further comprising:
performing a second treatment process on the second metal oxide layer; and
after performing the second treatment process, removing a portion of the second metal oxide layer from the second region.
17. The method of claim 16, wherein the first treatment process comprises a thermal treatment process, and wherein the second treatment process comprises a plasma treatment process.
18. The method of claim 15, wherein the first treatment process comprises increasing a surface roughness of the first metal oxide layer.
19. The method of claim 18, wherein increasing the surface roughness of the first metal oxide layer comprises increasing a semiconductor material deposition selectivity between the semiconductor substrate and the first metal oxide layer.
20. The method of claim 9, wherein etching to remove the portion of the oxide mask layer from the first fin comprises an anisotropic etch, and wherein etching to remove the remaining portion of the oxide mask layer comprises an isotropic etch.

\* \* \* \* \*